(12) United States Patent
Button et al.

(10) Patent No.: US 10,181,164 B2
(45) Date of Patent: Jan. 15, 2019

(54) PROCESSING DATA TO ESTABLISH LIFECYCLE THREADS IN THE DEVELOPMENT OF A STRUCTURAL PRODUCT

(71) Applicant: THE BOEING COMPANY, Chicago, IL (US)

(72) Inventors: Scott D. Button, Snohomish, WA (US); Thomas Edward Sherer, Everett, WA (US); Tek David Kim, Snohomish, WA (US)

(73) Assignee: THE BOEING COMPANY, Chicago, IL (US)

( * ) Notice: Subject to any disclaimer, the term of this patent is extended or adjusted under 35 U.S.C. 154(b) by 383 days.

(21) Appl. No.: 15/171,723

(22) Filed: Jun. 2, 2016

(65) Prior Publication Data

US 2017/0351986 A1    Dec. 7, 2017

(51) Int. Cl.
*B64F 5/00* (2017.01)
*G06F 17/50* (2006.01)
*G06Q 10/06* (2012.01)
*G06Q 50/04* (2012.01)

(52) U.S. Cl.
CPC .............. *G06Q 50/04* (2013.01); *B64F 5/00* (2013.01); *G06F 17/50* (2013.01); *G06Q 10/06311* (2013.01); *G06Q 10/06316* (2013.01)

(58) Field of Classification Search
CPC .................. G06Q 10/06316; G06Q 50/04
See application file for complete search history.

(56) References Cited

U.S. PATENT DOCUMENTS

| | | | |
|---|---|---|---|
| 6,643,639 B2 | 11/2003 | Biebesheimer et al. | |
| 7,873,920 B2 | 1/2011 | Grose et al. | |
| 7,899,768 B2 | 3/2011 | Grose et al. | |
| 8,581,904 B2 | 11/2013 | Grose et al. | |
| 2004/0162741 A1* | 8/2004 | Flaxer ............. | G06Q 10/06316 705/7.26 |
| 2009/0006293 A1* | 1/2009 | Grose .................. | G06Q 10/06 706/20 |

(Continued)

FOREIGN PATENT DOCUMENTS

CA    2793400 A1    7/2013

*Primary Examiner* — Brian W Wathen
(74) *Attorney, Agent, or Firm* — Womble Bond Dickinson (US) LLP

(57) ABSTRACT

A method is provided for processing data to establish lifecycle threads in the development of a structural product. The method includes defining a source lifecycle thread from process-related information for development of the structural product, and defining and matching a target lifecycle thread to the source lifecycle thread. The process, and source and target lifecycle threads are expressible as respectively a network and sub-networks of tasks described by a plurality of attributes. For defining either or each of the source lifecycle thread or target lifecycle thread, the method includes at least receiving user selection of an attribute of the plurality of attributes as user-selected criteria, performing a cluster analysis according to the user-selected criteria to produce a plurality of clusters of candidate tasks from the plurality of tasks, and selecting tasks from the plurality of clusters of candidate tasks for the source/target lifecycle thread.

21 Claims, 16 Drawing Sheets

(56) References Cited

U.S. PATENT DOCUMENTS

| | | | |
|---|---|---|---|
| 2011/0087516 A1* | 4/2011 | Frieden | G06Q 10/06 705/7.26 |
| 2014/0222487 A1 | 8/2014 | Grose et al. | |
| 2016/0132809 A1* | 5/2016 | Nakamura | G06Q 10/06316 704/9 |
| 2016/0306332 A1* | 10/2016 | Hill | G05B 19/0426 |
| 2017/0185938 A1* | 6/2017 | Volkov | G06Q 10/06398 |

* cited by examiner

PROCESSING DATA TO ESTABLISH LIFECYCLE THREADS IN THE DEVELOPMENT OF A STRUCTURAL PRODUCT

CROSS-REFERENCE TO RELATED APPLICATION(S)

The present application is related to U.S. patent application Ser. No. 15/171,744, entitled: Processing Data to Replicate Lifecycle Threads in the Development of a Structural Product, filed Jun. 2, 2016, the content of which is incorporated herein by reference in its entirety.

TECHNOLOGICAL FIELD

The present disclosure relates generally to development of a structural product and, in particular, to processing data to establish and replicate lifecycle threads in the development of a structural product such as an aircraft.

BACKGROUND

Complex projects such as the planning and production of large commercial or military aircraft require the scheduling and coordination of a plurality of resources. The resources to be coordinated may include materials, component parts, personnel, machinery and factory floor space, in addition to other resources. Integration and coordination is particularly important in complex projects since higher-order effects and interactions can adversely affect the cost of the project, the time required for completion of the project, and the risk of failure to deliver the required content. In addition, other variables of importance such as the overall effectiveness of the project need to be modeled and measured.

For large scale, complex product development, the coordination of resources is accomplished by modeling the steps in product development as tasks, with inputs associated to each task. The set of tasks, task attributes, and the input relationships constitutes a model for the development and production of a product of interest. The inputs to each task may be produced by earlier tasks, or may be produced outside the bounds of the model and considered as external inputs.

The set of tasks developed for the coordination of resources are profuse (10,000-100,000 tasks) and often inconsistent in their naming convention for tasks and associated data names. Tasks are associated with respective attributes. The profuse, inconsistent data and plurality of attributes, along with the requirement to maintain a well-ordered process present obstacles to the use of emergent patterns as templates to reduce the time and cost needed to develop project plans sufficient for effective scheduling and coordination of resources.

These emergent patterns of tasks and inputs may be referred to as "threaded lifecycle patterns" or "lifecycle threads" when considered in the lifecycle maturity phases of product development, such as a component part, assembly, subsystem or system. In order to detect these threaded lifecycle patterns in a network of tasks, it is necessary to associate together a subset of these tasks that are related in a network. Techniques exist for finding patterns in data, but these techniques suffer from a number of drawbacks when considered for establishment and use of threaded lifecycle patterns.

Therefore it would be desirable to have a system and method that takes into account at least some of the issues discussed above, as well as other possible issues.

BRIEF SUMMARY

Clustering is a well-known technique for finding patterns in data. Cluster analysis or "clustering" is the task of grouping a set of objects in such a way that objects in the same group (called a cluster) are more similar (in some sense or another) to each other than to those in other groups (clusters). Cluster analysis is not an automatic task, but an iterative process of knowledge discovery or interactive multi-objective optimization that involves trial and failure. However, the existing solutions to clustering use standardized criteria and weights. The drawback is that the clusters are not customizable to collect necessary network elements for a lifecycle thread.

A related obstacle is that the naming convention for tasks and associated task data is not always consistent, rendering search techniques labor-intensive. For example, a current commercial airplane process model in development has over 10,000 tasks and over 46,000 task relationships. When complete, this model will have over 100,000 tasks and 500,000 task relationships. The obstacle with interactive handling of large data sets using current approaches is that large multi-dimensional matrices are required. Due to the processing requirements for these large multi-dimensional matrices, interactive interrogation of the data is infeasible. With N tasks, on the order of $N^2$ comparisons are needed. Using conventional methods, each comparison would require a distance computation involving in an example implementation up to eight attributes.

Example implementations of the present disclosure are generally directed to a system, and corresponding method and computer-readable storage medium for processing data to establish and replicate lifecycle threads in the development of one or more structural products such as aircraft. Example implementations enable customization of clusters to collect necessary network elements for a lifecycle thread. Example implementations also replace computationally intensive operations with lookup and addition to reduce the computation, and used distance maps to reduce data storage requirements.

Example implementations of the present disclosure introduces the concept of a manifest that contains and maintains grouping information and the current clustering state. The grouping construct may be instantiated for each attribute (data field) selected for clustering, and the clustering state is the association of tasks with clusters. Each grouping maintains a mapping between the unique values of an attribute and the distances between those values, as defined by a distance metric for the attribute. In some examples, the unique value distance mapping of the grouping maintains distances as normalized quadrance components for each attribute. By maintaining a mapping of unique values and the distances between them as quadrance components, interactive processing is reduced to an ordinal comparison. This avoids the computational-intensive square root, and many multiplication and addition steps.

The present disclosure thus includes, without limitation, the following example implementations. In some example implementations, a method is provided for processing data to establish lifecycle threads in the development of a structural product. The method includes accessing, by processing circuitry, a memory storing process-related information describing at least one hierarchical, well-ordered process expressible as at least one network including a plurality of tasks to produce internal products corresponding to components of at least one structural product produced thereby, at least some of the plurality of tasks having a precedence relationship whereby the internal product produced by one task is an input to another task; defining, by the processing circuitry, a source lifecycle thread from the process-related information; and defining and matching, by the processing circuitry, a target lifecycle thread to the source lifecycle thread, the source lifecycle thread and target lifecycle thread each being expressible as a sub-network of respectively source tasks and target tasks selected from the plurality of tasks, the target tasks having at least a threshold similarity with the source tasks, and inputs to the target tasks having at least a threshold similarity with inputs to the source tasks, wherein the process-related information describes the plurality of tasks by a plurality of attributes In the foregoing example implementations, either or each of defining the source lifecycle thread, or defining and matching the target lifecycle thread, includes at least receiving user selection of an attribute of the plurality of attributes as user-selected criteria; performing a cluster analysis according to the user-selected criteria to produce a plurality of clusters of candidate tasks from the plurality of tasks, performing the cluster analysis including forming a grouping of the plurality of tasks according to the attribute, generating a distance map for the grouping including only unique values of the attribute and distances between the unique values, and organizing the tasks into the plurality of clusters of candidate tasks according to distance using the distance map; and selecting tasks from the plurality of clusters of candidate tasks for the source tasks or target tasks.

In some example implementations of the method of any preceding or any subsequent example implementation, or any combination thereof, receiving user selection of the attribute includes receiving user selection of a plurality of attributes as the user-selected criteria, wherein forming the grouping includes forming a respective plurality of groupings according to the plurality of attributes, generating the distance map includes generating a distance map for each grouping of the respective plurality of groupings, and organizing the tasks includes organizing the tasks using the distance map for each grouping, and wherein selecting the tasks includes selecting the tasks from a selected cluster of the plurality of clusters.

In some example implementations of the method of any preceding or any subsequent example implementation, or any combination thereof, receiving user selection of the plurality of attributes includes receiving user selection of the plurality of attributes and a weight for a particular attribute thereof as the user-selected criteria, and wherein performing the cluster analysis further includes applying the weight to the distance map for the grouping according to the particular attribute, and organizing the tasks includes organizing the tasks using the distance map for each grouping including the distance map with the weight so applied.

In some example implementations of the method of any preceding or any subsequent example implementation, or any combination thereof, defining the source lifecycle thread or defining the target lifecycle thread further includes receiving user selection of an adjusted weight for the particular attribute, and wherein performing the cluster analysis further includes applying the adjusted weight to the distance map for the grouping according to the particular attribute, and reorganizing the tasks using the distance map for each grouping including the distance map with the adjusted weight so applied.

In some example implementations of the method of any preceding or any subsequent example implementation, or any combination thereof, each of defining the source lifecycle thread, and defining and matching the target lifecycle thread, includes receiving user selection of the attribute, performing the cluster analysis and selecting the tasks, and wherein in an instance in which the attribute received for both the source lifecycle thread and target lifecycle thread is the same, defining and matching the target lifecycle thread includes organizing the tasks using the distance map generated during the cluster analysis for the source lifecycle thread without again generating the distance map during the cluster analysis for the target lifecycle thread.

In some example implementations of the method of any preceding or any subsequent example implementation, or any combination thereof, defining and matching the target lifecycle thread includes at least selecting a plurality of candidate target tasks from the plurality of tasks, the plurality of candidate target tasks being selected from the plurality of clusters of candidate tasks in an instance in which defining and matching the target lifecycle thread includes performing the cluster analysis; matching a candidate target task to a particular source task of the source lifecycle thread; and back-chaining through the source lifecycle thread including for each source task of at least some of the source tasks beginning with the particular source task: identifying a preceding source task that inputs to the source task; and matching another candidate target task to any preceding source task, the target lifecycle thread being composed of the candidate target task and other candidate target task matched to the preceding source task for each source task of the at least some of the source tasks.

In some example implementations of the method of any preceding or any subsequent example implementation, or any combination thereof, in at least one instance in which the candidate target task and other candidate target task are precedence unrelated, back-chaining through the source lifecycle thread further includes defining an input to the candidate target task from the other candidate target task to thereby establish a precedence relationship.

In some example implementations, an apparatus is provided for processing data to establish lifecycle threads in the development of a structural product. The apparatus comprises a memory storing process-related information, and processing circuitry configured to access the memory, and programmed to at least perform the method of any preceding example implementation, or any combination thereof. This may include implementation of a lifecycle thread establishment and replication system including a source lifecycle thread subsystem and a target lifecycle thread subsystem coupled to one another and configured to perform steps of the method.

In some example implementations, a computer-readable storage medium is provided for processing data to establish and replicate lifecycle threads in the development of a structural product. The computer-readable storage medium is non-transitory and has computer-readable program code portions stored therein that, in response to execution by processing circuitry, cause an apparatus to at least perform the method of any preceding example implementation, or any combination thereof.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as intended, namely to be combinable, unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
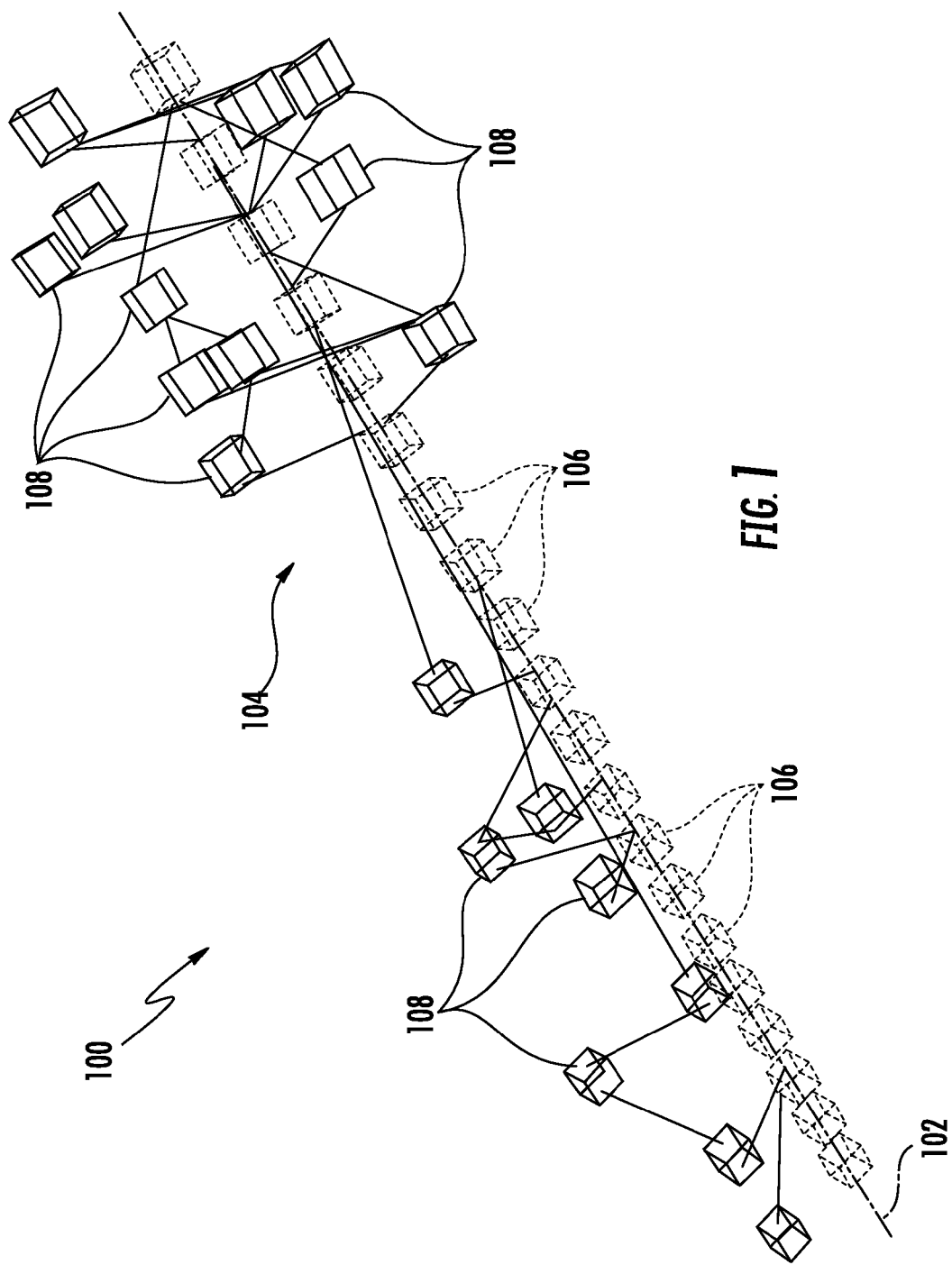
FIGS. 1 and 2 illustrate feed-forward networks in accordance with example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

Example implementations of the present disclosure are directed to establishment and replication of lifecycle threads in one or more processes for production of one or more products—i.e., product-production process(es). In accordance with example implementations, a product, including physical products (e.g., objects) and non-physical products (e.g., information), may be described in terms of a hierarchical breakdown (hereinafter referred to as a "hierarchy") of the product's components. A "process" may be adapted to describe production of the product by defining tasks and precedences associated with the creation of each component. For example, the precedences may indicate that a particular task should be completed before another task is performed. In various examples, a task may refer to an activity or set of activities performed during creation of a component.

A complex process may include one or more sub-processes each of which may at times be considered a separate process without regard to the complex process or others of the sub-processes. In one example, the process may be expressible as a network. A suitable network may be constructed in any of a number of different manners. In one example, the network may be constructed in accordance with technologies described in U.S. Pat. No. 7,899,768 entitled: Methods and Systems for Constructing a Scalable Hierarchical Feed-Forward Model for Fabricating a Product, issued Mar. 1, 2011, and U.S. Patent Application Publication No. 2014/0222487, entitled: Total-Ordering in Process Planning, published Aug. 7, 2014, the contents of both of which are hereby incorporated by reference in their respective entireties.

In some examples, the process, and thus its network expression, may be adapted to maintain a feed-forward constraint such that no cycles or loops are contained within the process. In some examples, the process and its network expression may also be adapted to maintain a well-ordered constraint such that its tasks are well-ordered (referring to a set in which every non-empty subset has a minimum element). The process and its network expression may also be scalable such that it may be combined with other processes to generate a larger process.

As used herein, a "product" may refer to something input into or produced by a process in the network. An illustrative process may be a commercial aircraft development process. In one example, a product of the commercial aircraft development process may include an aircraft or a part of the aircraft (e.g., fuselage section, wing, landing gear, engine, etc.). In another example, the product may include a type certificate or other relevant document related to legal use of the aircraft. In yet another example, the product may include a design specification or other dataset related to the design and/or construction of the aircraft. Some other examples of products may include a wing center section, a control column and wheel, an overhead stowage bin, a layout of passenger arrangement, front spar interface loads, pitching moment curves and the like.

The product may be either an "internal product" or an "external product." An internal product may be producible by one or more tasks in the network (the respective one or more tasks in various instances being considered a subprocess). In one example, an internal product may be considered a segment, which may be an internal product that is not a component of another internal product, but is instead intended to be broken into more detailed components. An internal product may receive as input an external product and/or an internal product. Some examples of internal products in the commercial aircraft development process may include avionics, propulsion systems, engine-specific fuel consumption curves and the like. Each internal product may include one or more "internal inputs," which may be utilized or needed to produce the internal product.

The internal inputs may include "internal components" and "component inputs." The internal components may refer to a subset of non-external inputs that is not part of the same segment as the internal product. The component inputs may refer to a subset of non-external inputs that is part of the same segment as the internal product. Each component input may include multiple "component products," the aggregate of which form the component input. An illustrative internal product may be a subassembly. For the subassembly, an example component input may be parts of the subassembly, and an example internal component may be a tool that assembles the parts to produce the subassembly. In this case, the parts assemble to form the subassembly. As such, the parts are considered in the same segment as the subassembly. In contrast, the tool that assembles the parts is not included within the subassembly. As such, the tool is considered as not part of the same segment as the subassembly.

The external product may be produced outside of a process in the network. In contrast to the internal product, input to the external product may not be represented in the context of the process or its network expression. Some examples of external products in the commercial aircraft development process may include regulatory requirements, customer requirements, company ground rules, existing facilities and the like. The external product may include multiple components, the aggregate of which forms the external product. Each such component forming the external product may be referred to herein as an "external component." The internal products, external products, internal components, component inputs and/or external components may form the set of inputs into a process adapted to produce any given internal product.

Each internal product may be a component. Each component may include multiple nested components, and may further include additional nested components at deeper levels of the hierarchy. In the commercial aircraft development process, some examples of segment components may include technology assessment, exploratory design, conceptual design, preliminary design, production system, infrastructure, detail manufacturing plans, vehicle product, product validation and the like. The example component "infrastructure" may include a nested component "production facilities," which further includes a nested component "major assemblies." The component "major assemblies" may include a nested component "wing center section," which further includes a nested component "upper panel." Additional nested components may continue from the component "upper panel."

As used herein, an "input" may refer to a product, such as an internal or external product, that may be utilized or required by the task to produce another product. That is, a statement that a first product is input to a second product may refer to the utilization or requirement of the first product by the task to produce the second product. For example, an internal product may be a design specification of an airplane wing. An external product may be specifications of fasteners that are utilized or required in the production of the detailed design. In this case, since the design specification of the airplane wing utilizes or requires the specifications of fasteners, the specifications of fasteners may also be referred to as an external input to the design specification of the airplane wing. According to some example implementations, an internal product can receive an input, but an external product cannot receive an input. Example technologies for selecting the inputs are described in the above-referenced and incorporated '768 patent.

FIG. 1 illustrates an example layout of a suitable network diagram 100 that may express a process of one example implementation. Standard network characteristics may be used in the layout to add meaning to displayed data. As shown, for example, the network includes a central time-directed axis 102, and a plurality of network nodes 104 that express respective products of the process. The nodes may be connected by edges reflecting precedence relationships between the nodes, and correspondingly between the respective products of the process. Each of the network nodes may include an associated slack parameter that may be used to determine a distance of the network node from central time-directed axis. In this regard, nodes 106 having zero slack values may be selected to lie on or near the axis, and other nodes 108 having higher slack values may be positioned about the axis. In one example, nodes 106 may be strictly-ordered nodes without flexibility in their order (linearly constrained), and the axis may be a linear, strictly-ordered axis. In this example, the other nodes 108 may be parallel nodes that have some flexibility in their order.

Figure 2:
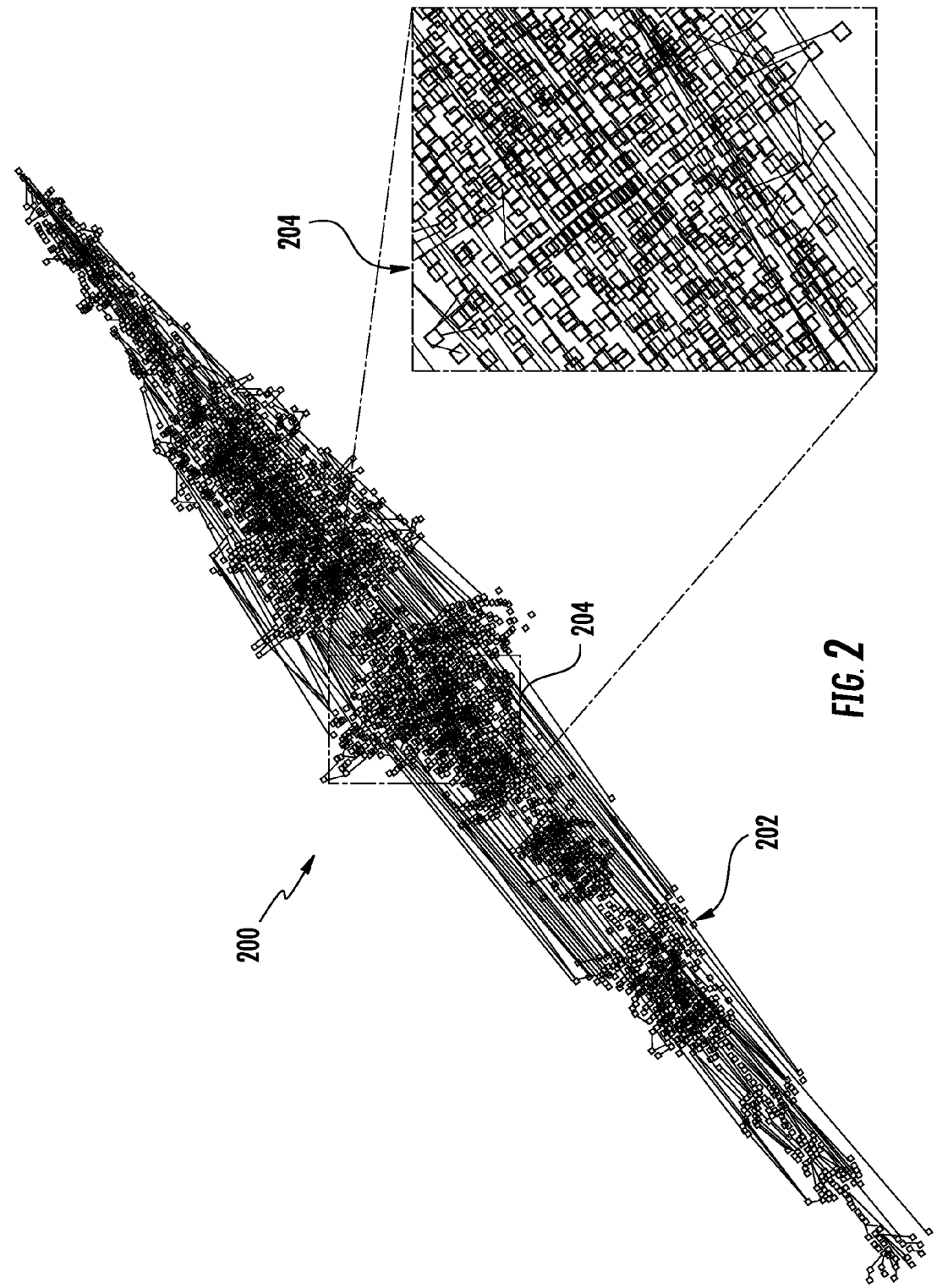

FIG. 2 illustrates a suitable network diagram 200 similar to diagram 100, but that may express a more complex process. As shown, similar to the diagram of FIG. 1, the network diagram of FIG. 2 a plurality of network nodes 202 that may be connected by edges reflecting precedence relationships between the nodes, a portion of which are further highlighted in inset 204. For more information regarding the layouts of FIGS. 1 and 2, as well as other suitable layouts according to example implementations, see U.S. Pat. No. 7,873,920, entitled: Methods and Systems for Displaying Network Information, issued Jan. 18, 2011, the content of which is hereby incorporated by reference in its entirety. For other example layouts of suitable network diagrams, see U.S. Pat. No. 8,581,904, entitled: Three-Dimensional Display of Specifications in a Scalable Feed-Forward Network, issued Nov. 12, 2013, the content of which is hereby incorporated by reference in its entirety.

In a network diagram such as the network diagrams 100, 200 of FIGS. 1 and 2, the nodes 104, 202 may represent the tasks to produce the internal products. The edges connecting nodes, then, may represent the internal products and reflect the precedence relationships between tasks. For example, an internal product that is utilized or required for production of another internal product may be represented by an edge connecting nodes representing the tasks to produce the respective internal product and other internal product. In this example, the task to produce the internal product may be considered a predecessor, and the task to produce the other internal product may be considered a successor. In this manner, the tasks (nodes) to produce internal products of the process expressed by the network may be properly ordered according to the internal products (edges) connecting them.

A process such as a hierarchical, well-ordered process according to example implementations may be described by process-related information and expressible as at least one network including a plurality of tasks to produce internal products corresponding to components of at least one product produced thereby. As described above, at least some of the tasks may have a precedence relationship whereby the internal product produced by one task is an input to another task. The process-related information may describe the internal products, external products, internal components, component inputs and/or external components of the process. The process-related information may describe the tasks to produce the internal product, and precedence relationships between tasks (predecessors, successors). In accordance with example implementations, the process-related information describes the plurality of tasks by a plurality of attributes (data fields).

As described below in Table 1, examples of suitable attributes include as-late-as-possible (ALAP) position, as-soon-as-possible (ASAP) position, band number, input, location, name, organization, product, qualifier, uniform resource identifier (URI) and verb.

TABLE 1

| Attribute | | |
| --- | --- | --- |
| Name | Type | Purpose |
| ALAP position | Integer | The band number that contains this product when ordered as-late-as-possible. |
| ASAP position | Integer | The band number that contains this product when ordered as-soon-as-possible. |
| Band Number | Integer | A count of the sets of preceding parallel activities (e.g., band number one may include all tasks without predecessors). |
| Input | URI | List of inputs needed in order to complete the task. An input may also be a task. |
| Location | String | Identify the geographic or spatial location of a task or data item. |
| Name | String | Provide a name for a task or data item. |
| Organization | String | Name of organization performing the task. |
| Product | Object | A product, task or activity is a description of the act of producing a data deliverable. |
| Qualifier | String | Modify the name of a task or data item. |
| URI | String | Uniquely identify the task or data item. |
| Verb | String | A word describing an action that is pre-pended to a data deliverable to describe the task that produces the data deliverable. |

Figure 3:
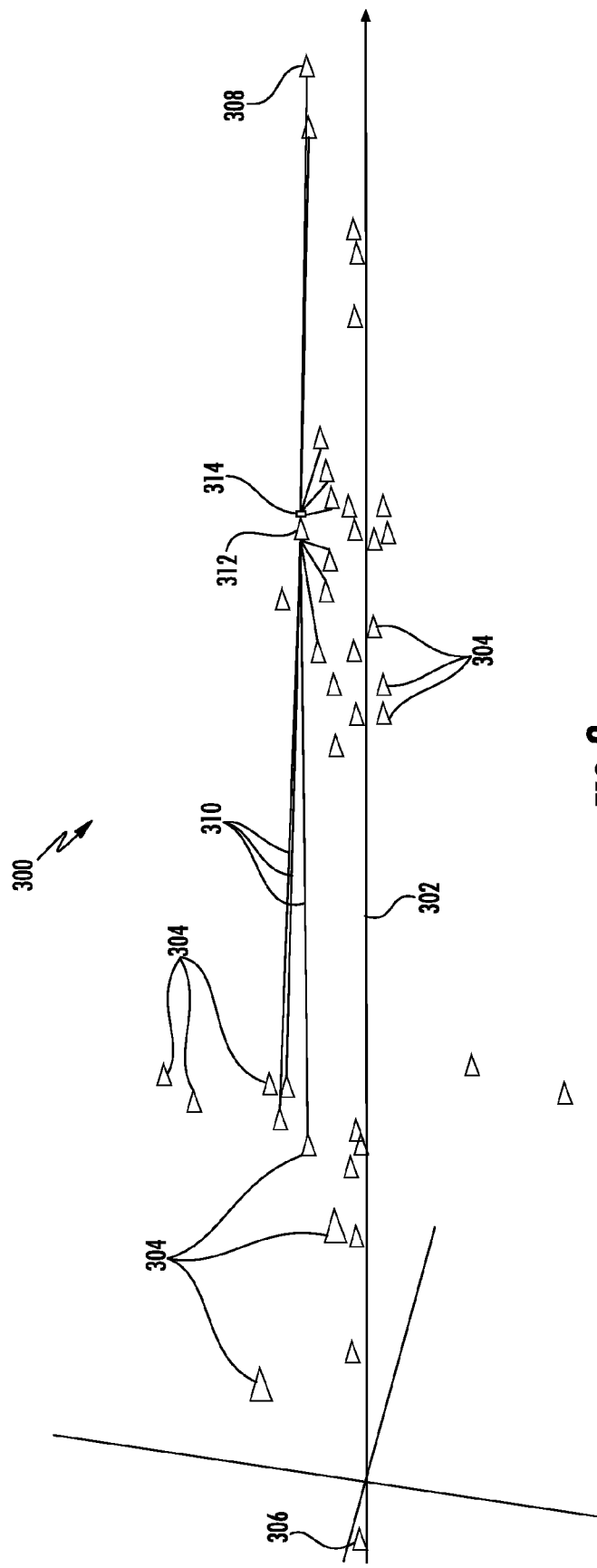
FIG. 3 illustrates a network diagram of one example of a suitable lifecycle thread according to example implementations.

As explained above, a process may include emergent patterns of tasks and inputs, which may be referred to as "threaded lifecycle patterns" or "lifecycle threads" when considered in the lifecycle maturity phases of product development. FIG. 3 illustrates a network diagram 300 of one example of a suitable lifecycle thread for the design and production of a flight test, according to example implementations. Similar to before, the network includes a central time-directed axis 302, and a plurality of network nodes 304 that express respective tasks to produce internal products of the process. The nodes are arranged along the time-directed axis with tasks for the earliest or least mature products at the left, and tasks for the latest or most mature products at the right. In the context of a flight test process, for example, the node 306 that expresses one of the earliest tasks may be for release of a model definition, detail design, and the node 308 for one of the latest if not the terminal task may be update loadable software databases and models, product verification.

Also similar to before, the nodes 302 may be connected by edges 310 reflecting precedence relationships between the nodes, and correspondingly between the respective tasks of the process. The edges for some precedence relationships are shown, while others are elided for clarity. In addition, the node 312 for a selected task may be identified in the network by a sphere 314 or other appropriate shape.

Figure 4:
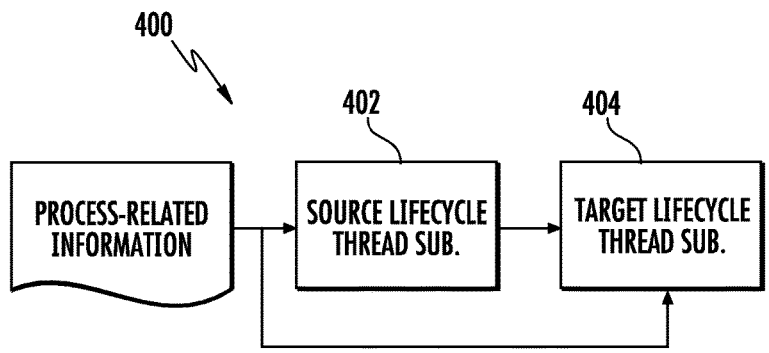
FIG. 4 illustrates a lifecycle thread establishment and replication system according to example implementations.

Example implementations of the present disclosure are directed to establishment and replication of lifecycle threads, which may be detected based on one or more attributes of the tasks. FIG. 4 illustrates a lifecycle thread establishment and replication system 400 according to example implementations. The lifecycle thread establishment and replication system may be configured to perform a number of different functions or operations, either automatically, under direct operator control, or some combination of thereof. In this regard, the system may be configured to perform one or more of its functions or operations automatically, that is, without being directly controlled by an operator. Additionally or alternatively, the system may be configured to perform one or more of its functions or operations under direct operator control.

The lifecycle thread establishment and replication system 400 may include one or more of each of any of a number of different subsystems (each an individual system) for performing one or more functions or operations of the lifecycle thread establishment and replication system. As shown, for example, the system may include a source lifecycle thread subsystem 402 and a target lifecycle thread subsystem 404 coupled to one another. Although being shown together as part of the system, it should be understood that either of the subsystems may function or operate as a separate system without regard to the other. And further, it should be understood that the system may include one or more additional or alternative subsystems than those shown in FIG. 4.

The source lifecycle thread subsystem 402 may be configured to define a source lifecycle thread from process-related information. As described above, this process-related information describes at least one hierarchical, well-ordered process expressible as at least one network including a plurality of tasks to produce internal products corresponding to components of at least one product produced thereby. And at least some of the plurality of tasks having a precedence relationship whereby the internal product produced by one task is an input to another task. The source lifecycle thread subsystem may therefore establish a source lifecycle thread.

The target lifecycle thread subsystem 404 may be configured to define and match a target lifecycle thread to the source lifecycle thread. The target lifecycle thread may thereby replicate the source lifecycle thread to establish the target lifecycle thread. The source lifecycle thread and target lifecycle thread may each be expressible as a sub-network of respectively source tasks and target tasks selected from the plurality of tasks. The target tasks have at least a threshold similarity with the source tasks, and inputs to the target tasks have at least a threshold similarity with inputs to the source tasks.

Figure 5:
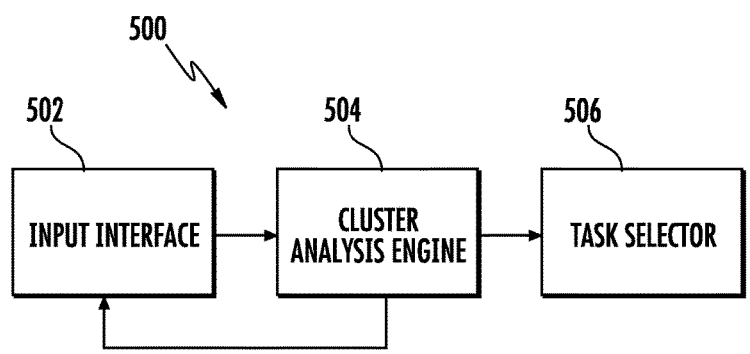
FIG. 5 illustrates one example of a suitable clustering subsystem according to example implementations.

To establish either or both of the source lifecycle thread or target lifecycle thread, either or both the source lifecycle thread subsystem 402 or the target lifecycle thread subsystem 404 may include a clustering subsystem. FIG. 5 illustrates one example of a suitable clustering subsystem 500 according to example implementations of the present disclosure.

Similar to the lifecycle thread establishment and replication system 400, the clustering subsystem 500 may be configured to perform a number of different functions or operations, either automatically, under direct operator control, or some combination of thereof. Likewise, the clustering subsystem may include one or more of each of any of a number of different subsystems (each an individual system). As shown, for example, the clustering subsystem may include an input interface 502, cluster analysis engine 504 and task selector 506 coupled to one another, although any of the aforementioned may function or operate as a separate system without regard to the other. And further, the clustering subsystem may include one or more additional or alternative subsystems than those shown in FIG. 5.

The input interface 502 may be configured to receive user selection of an attribute of the plurality of attributes as user-selected criteria. From the above Table 1, examples of suitable attributes include name, qualifier, location, organization, ASAP position, ALAP position, verb, URI or the like. The cluster analysis engine 504 may be configured to perform a cluster analysis according to the user-selected criteria to produce a plurality of clusters of candidate tasks from the plurality of tasks.

Cluster analysis or "clustering" is the task of grouping a set of objects in such a way that objects in the same group (called a cluster) are more similar (in some sense or another) to each other than to those in other groups (clusters). Cluster analysis is not an automatic task, but an iterative process of knowledge discovery or interactive multi-objective optimization that involves trial and failure. To facilitate this knowledge discovery, the user-selected criteria may include one or more attributes such as those identified above. The task selector may then be configured to select tasks from the plurality of clusters of candidate tasks for the source tasks or target tasks.

Figure 6:
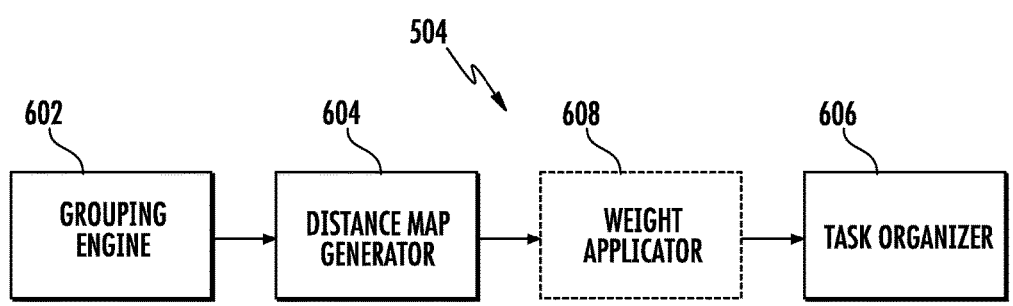
FIG. 6 illustrates one example of a suitable cluster analysis engine according to example implementations.

FIG. 6 more particularly illustrates the cluster analysis engine 504 according to some example implementations. Again, the cluster analysis engine may be configured to perform a number of different functions or operations, either automatically, under direct operator control, or some combination of thereof. Likewise, the cluster analysis engine may include one or more of each of any of a number of different subsystems (each an individual system). As shown, for example, the cluster analysis engine may include a grouping engine 602, distance map generator 604 and task organizer 606 coupled to one another, although any of the aforementioned may function or operate as a separate system without regard to the other. And further, the cluster analysis engine may include one or more additional or alternative subsystems than those shown in FIG. 6.

Some example implementations of the present disclosure introduce the concept of a grouping that maintains and contains unique value distance maps for each attribute selected by the user as clustering criteria. As described above, each unique value distance map may be a mapping between the unique values of an attribute and the distances between those values (as defined by each attribute's distance metric implementation). In accordance with these example implementations, then, the grouping engine 602 may be configured to form a grouping of the plurality of tasks according to the attribute. The distance map generator 604 may be configured to generate a distance map for the grouping including only unique values of the attribute and distances between the unique values, and in some examples, these unique values may be normalized and perhaps also squared to form normalized quadrance components.

Distance is a quantification of the magnitude of dissimilarity between two products. The computation of distance may be established for each attribute, and determined based on the data type of the attribute and the objective of the cluster analysis. For example, the Levenshtein distance between two words is the minimum number of single-character edits (insertions, deletions or substitutions) required to change one word into the other. An example distance function used with phrases is based on a count of the number of words in common. Specifically, this distance function is calculated by dividing twice the count of words different between two product names by the sum of the unique word count in each product name. An example distance function used with verbs is binary—either the verbs are the same (distance zero) or the verbs are different (distance one).

Unique values are those values of distances for unique relationships. An example of normalized unique values for URI distance is shown below in Table 2.

TABLE 2

| from URI 0.8.68.1: | |
|---|---|
| to 0.3.1.5 = | 1 |
| to 0.8.60.6 = | 0.444 |
| to 0.8.68.2 = | 0.111 |
| to 0.8.60.5 = | 0.444 |
| to 0.3.1.2 = | 1 |
| to 0.8.60.4 = | 0.444 |
| to 0.8.68.3 = | 0.111 |
| to 0.3.1.3 = | 1 |
| to 0.8.60.3 = | 0.444 |
| to 0.8.68.4 = | 0.111 |
| to 0.3.1.1 = | 1 |
| to 0.8.60.2 = | 0.444 |
| to 0.8.68.5 = | 0.111 |
| to 0.8.68.6 = | 0.111 |
| to 0.8.60.1 = | 0.444 |
| to 0.8.68.7 = | 0.111 |

As each URI is unique, the distance between every URI is a unique value, and the value is stored in the second column, the values {0.111, 0.444, 1}. Before normalization, the URI distance is a count of the differences between values of the URI's at each level of the hierarchy. As only the last digit differs, the distance between URI 0.8.68.1 and 0.8.68.5 is 1. Because two digits differ, the difference between URI 0.8.68.1 and 0.8.60.6 is 2. As three digits differ, the distance between URI 0.8.68.1 and 0.3.1.5 is 3. These distances are normalized and squared so they may be stored as normalized quadrance components $1^2/3^2$, $2^2/3^2$ and $3^2/3^2$ for the aforementioned normalized values of {0.111, 0.444, 1}.

In contrast to every URI as a unique value, there are a limited number of verbs associated with products, and many products use the same verb. For verbs, the distance between different verbs may be one, while the distance between the same verb may be zero. Memory and data storage requirements are collapsed by storing only these unique distance values. And by storing these distance values as normalized quadrance components, example implementations reduce interactive processing to an ordinal comparison, and thereby avoids the computational-intensive square root, and many multiplication and addition steps.

Regardless of the exact manner in which the distance map generator 604 is configured to generate the distance map, the task organizer 606 may be configured to organize the tasks into the plurality of clusters of candidate tasks according to distance using the distance map. The task organizer may organize the tasks in any of a number of different suitable manners, such as in accordance with any suitable distance-clustering algorithm. One example of a suitable distance-clustering algorithm is provided below.

In some examples, the input interface 502 may be configured to receive user selection of a plurality of attributes as the user-selected criteria. In these examples, the grouping engine 602 of the cluster analysis engine 504 may be configured to form a respective plurality of groupings according to the plurality of attributes. The distance map generator 604 may be configured to generate a distance map for each grouping of the respective plurality of groupings. The task organizer 606 may be configured to organize the tasks includes being caused to organize the tasks using the distance map for each grouping. And the task selector 506 may be configured to select the tasks from a selected cluster of the plurality of clusters.

In some examples, the input interface 502 may be configured to receive user selection of the plurality of attributes and a weight for a particular attribute thereof as the user-selected criteria. In some examples, the weight (or weights for multiple attributes) may be user-selectable for a normalized value in the range of 0 to 1. In this manner, a user who desires to evaluate clusters where the name provides a two times stronger association than the location, the weights of the name and location attributes may be set to respectively 1 and ½. In these examples, then, the cluster analysis engine 504 may further include a weight applicator 608 configured to apply the weight to the distance map for the grouping according to the particular attribute. The task organizer 606, then, may be configured to organize the tasks using the distance map for each grouping including the distance map with the weight so applied.

In some further examples, the input interface 502 may be further configured to receive user selection of an adjusted weight for the particular attribute. In these examples, the weight applicator 608 may be further configured to apply the adjusted weight to the distance map for the grouping according to the particular attribute. And the task organizer 606 may be further configured to reorganize the tasks using the distance map for each grouping including the distance map with the adjusted weight so applied.

In some examples, each of the source lifecycle thread subsystem 402 and the target lifecycle thread subsystem 404 may include a respective clustering subsystem 500. In these examples, in an instance in which the attribute received for both the source lifecycle thread and target lifecycle thread is the same, the task organizer 606 of the clustering subsystem for the target lifecycle thread subsystem may organize the tasks using the distance map generated during the cluster analysis of the clustering subsystem for the source lifecycle thread without the distance map generator 604 again generating the distance map during the cluster analysis for the target lifecycle thread.

Figure 7:
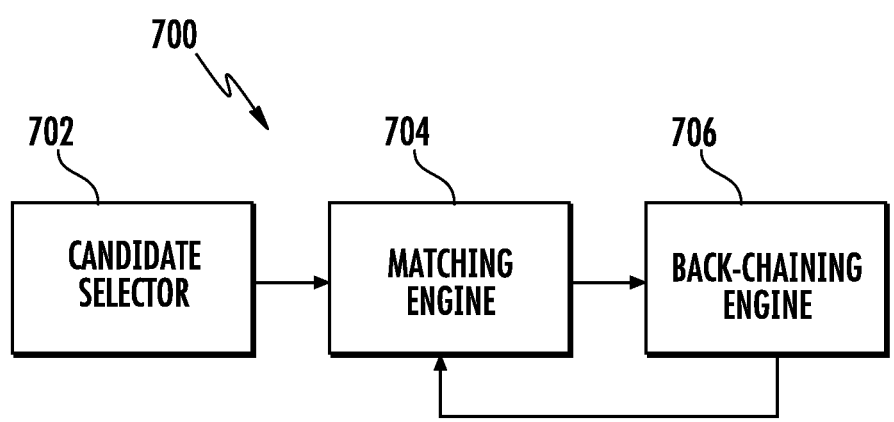
FIG. 7 illustrates a target lifecycle thread subsystem according to example implementations.

FIG. 7 illustrates a target lifecycle thread subsystem 700 that in some examples may correspond to the target lifecycle thread subsystem 404 of FIG. 4. As with other subsystems described herein, the target lifecycle thread subsystem may be configured to perform a number of different functions or operations, either automatically, under direct operator control, or some combination of thereof. Likewise, the target lifecycle thread subsystem may include one or more of each of any of a number of different subsystems (each an individual system). As shown, for example, the target lifecycle thread subsystem may include a candidate selector 702, matching engine 704 and back-chaining engine 706 coupled to one another, although any of the aforementioned may function or operate as a separate system without regard to the other. And further, the target lifecycle thread subsystem may include one or more additional or alternative subsystems than those shown in FIG. 7.

The candidate selector 702 may be configured to select a plurality of candidate target tasks from the plurality of tasks. In some examples, the candidate selector may be implemented by the clustering subsystem 500. In these examples, the plurality of candidate target tasks may be selected from the plurality of clusters of candidate tasks.

The matching engine 704 may be configured to match a candidate target task to a particular source task of the source lifecycle thread. In some examples, the matching engine may be configured to match the candidate target task to the particular source task using a distance map for an attribute of the plurality of attributes, with the distance map including only unique values of the attribute and distances between the unique values. In some examples in which the candidate selector is implemented by the clustering subsystem 500, the distance map may be the same as that generated by the distance map generator 604 of the cluster analysis engine 504.

The back-chaining engine 706 may be configured to back-chain through the source lifecycle thread. For each source task of at least some of the source tasks beginning with the particular source task, this may include the back-chaining engine being configured to at least identify a preceding source task that inputs to the source task. The matching engine 704 may then match another candidate target task to the preceding source task, such as with use of the distance map. In some examples in which the target tasks have a well order, the matching engine may be configured to match the other candidate target task that maintains the well order. Through this process, the target lifecycle thread may be composed of the candidate target task and other candidate target task matched to the preceding source task for each source task of the at least some of the source tasks.

In some examples, the matching engine 704 may be configured to remove the candidate target task from the plurality of candidate target tasks after the candidate target task is matched to the particular source task. Likewise, in these examples, the matching engine may be configured to remove the other candidate target task from the plurality of candidate target tasks after the other candidate target task is matched to the preceding source task. Moreover, in at least one instance in which the candidate target task and other candidate target task are precedence unrelated, the matching engine may be further configured to define an input to the candidate target task from the other candidate target task to thereby establish a precedence relationship.

Figure 8A:
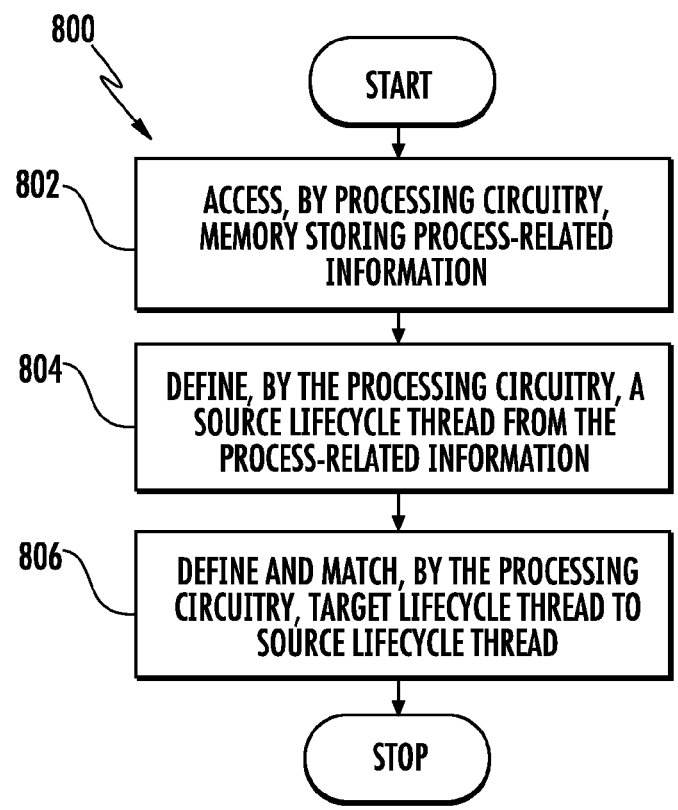
FIGS. 8A and 8B are flowcharts illustrating various steps in a method according to various example implementations.
Figure 8B:
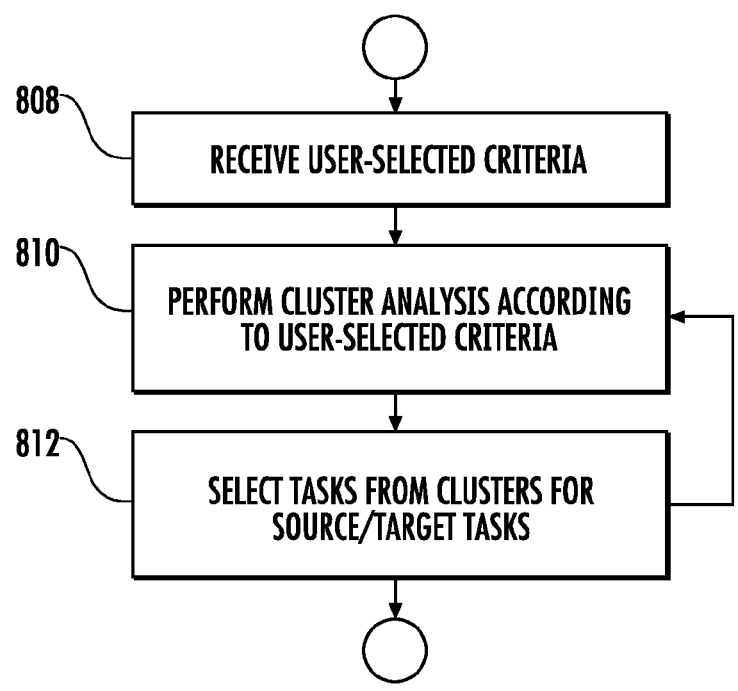

FIGS. 8A and 8B are flowcharts illustrating various steps in a method 800 according to example implementations of the present disclosure, and which are described in the context of the apparatus 1800 shown and described below with reference to FIG. 18. As shown at block 802, the method includes accessing, by processing circuitry 1802, a memory 1804 storing process-related information describing at least one hierarchical, well-ordered process. The process is expressible as at least one network including a plurality of tasks to produce internal products corresponding to components of at least one product produced thereby. In the network, at least some of the plurality of tasks having a precedence relationship whereby the internal product produced by one task is an input to another task.

As shown at block 804, the method includes defining, by the processing circuitry 1802, a source lifecycle thread from the process-related information. The method also includes defining and matching, by the processing circuitry, a target lifecycle thread to the source lifecycle thread, as shown at block 806. The source lifecycle thread and target lifecycle thread are each expressible as a sub-network of respectively source tasks and target tasks selected from the plurality of tasks. The target tasks have at least a threshold similarity with the source tasks, and inputs to the target tasks have at least a threshold similarity with inputs to the source tasks.

The process-related information describes the plurality of tasks by a plurality of attributes. Either or each of defining the source lifecycle thread (block 804), or defining and matching the target lifecycle thread (block 806), includes at least receiving user selection of an attribute of the plurality of attributes as user-selected criteria, as shown at block 808. Here, the method also includes performing a cluster analysis according to the user-selected criteria to produce a plurality of clusters of candidate tasks from the plurality of tasks, and selecting tasks from the plurality of clusters of candidate tasks for the source tasks or target tasks, as shown at blocks 810 and 812. And according to these example implementations, performing the cluster analysis including forming a grouping of the plurality of tasks according to the attribute, generating a distance map for the grouping including only unique values of the attribute and distances between the unique values, and organizing the tasks into the plurality of clusters of candidate tasks according to distance using the distance map.

Figure 9A:
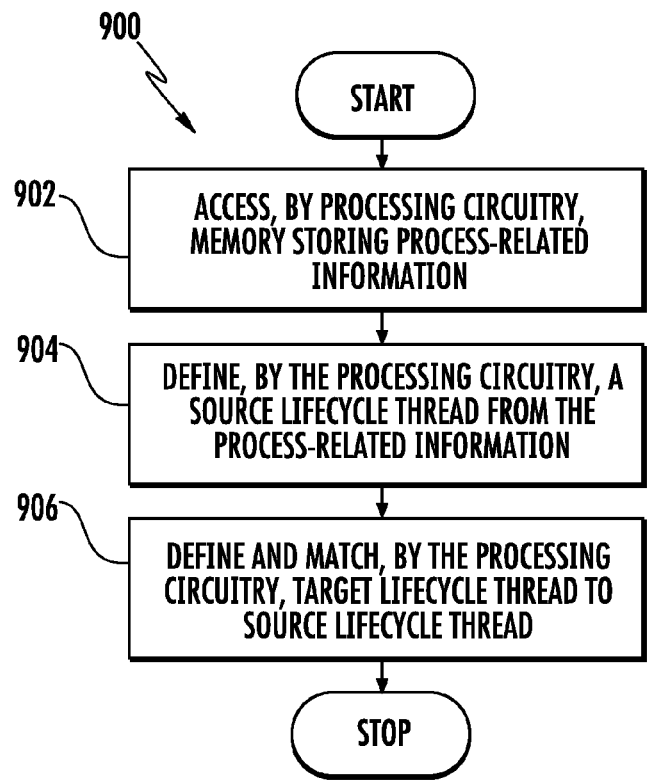
FIGS. 9A and 9B are flowcharts illustrating various steps in a method according to other example implementations.
Figure 9B:
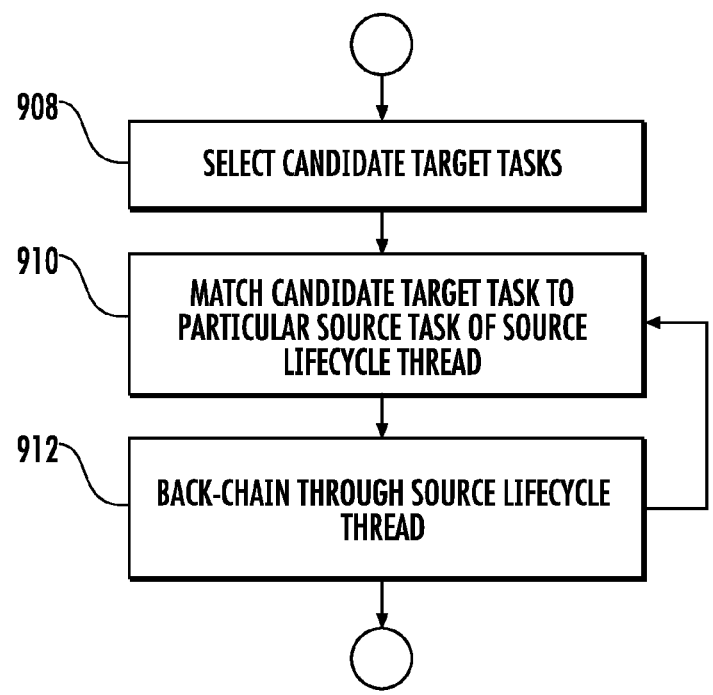

FIGS. 9A and 9B are flowcharts illustrating various steps in a method 900 according to example implementations of the present disclosure. As shown at block 902, the method includes accessing, by processing circuitry 1802, a memory 1804 storing process-related information describing at least one hierarchical, well-ordered process. The process is expressible as at least one network including a plurality of tasks to produce internal products corresponding to components of at least one product produced thereby. In the network, at least some of the plurality of tasks having a precedence relationship whereby the internal product produced by one task is an input to another task.

As shown at block 904, the method includes defining, by the processing circuitry 1802, a source lifecycle thread from the process-related information. The method also includes defining and matching, by the processing circuitry, a target lifecycle thread to the source lifecycle thread, as shown at block 906. The source lifecycle thread and target lifecycle thread are each expressible as a sub-network of respectively source tasks and target tasks selected from the plurality of tasks. The target tasks have at least a threshold similarity with the source tasks, and inputs to the target tasks have at least a threshold similarity with inputs to the source tasks.

The process-related information describes the plurality of tasks by a plurality of attributes. Defining and matching the target lifecycle thread (block 906) includes at least selecting a plurality of candidate target tasks from the plurality of tasks, as shown at block 908. Here, the method also includes matching a candidate target task of the plurality of candidate target tasks to a particular source task of the source lifecycle thread using a distance map for an attribute of the plurality of attributes, with the distance map including only unique values of the attribute and distances between the unique values, as shown at block 910.

The method here also includes back-chaining through the source lifecycle thread, as shown at block 912. For each source task of at least some of the source tasks beginning with the particular source task, this back-chaining may include identifying a preceding source task that inputs to the source task, and matching another candidate target task of the plurality of candidate target tasks to the preceding source task using the distance map. The target lifecycle thread, then, may be composed of the candidate target task and other candidate target task matched to the preceding source task for each source task of the at least some of the source tasks.

Figure 10:
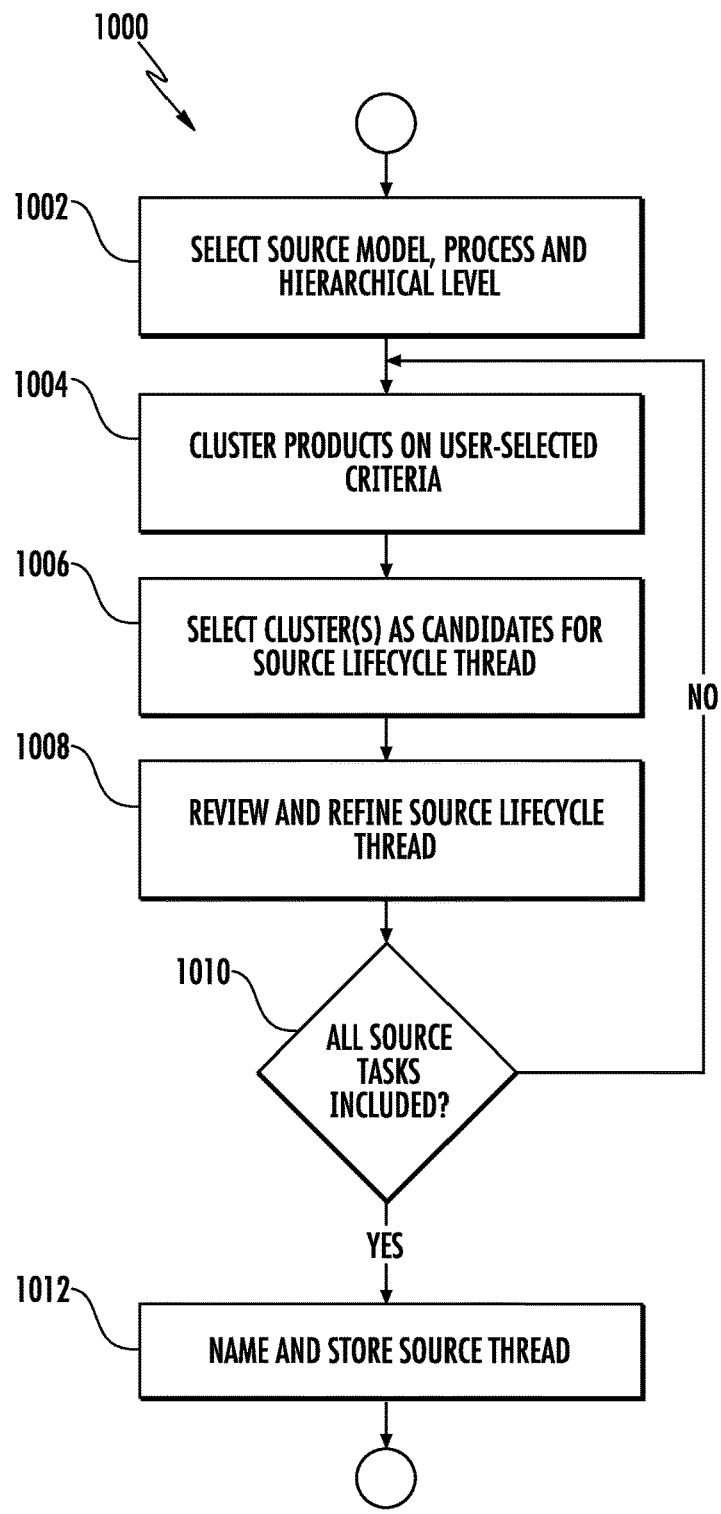
FIGS. 10, 11 and 12 are flowcharts illustrating operations in routines or subroutines that may be performed according to example implementations.
Figure 11:
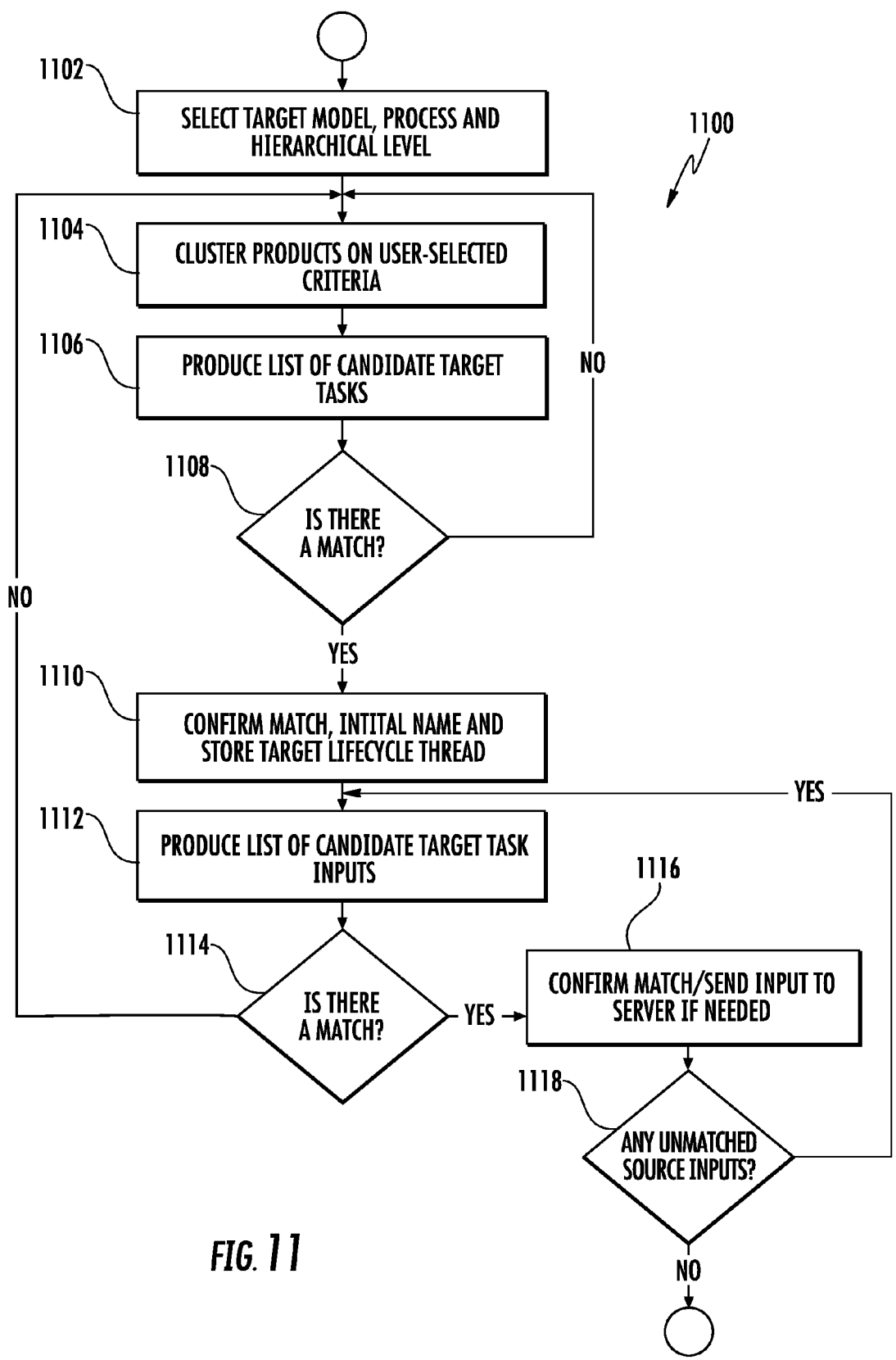
Figure 12:
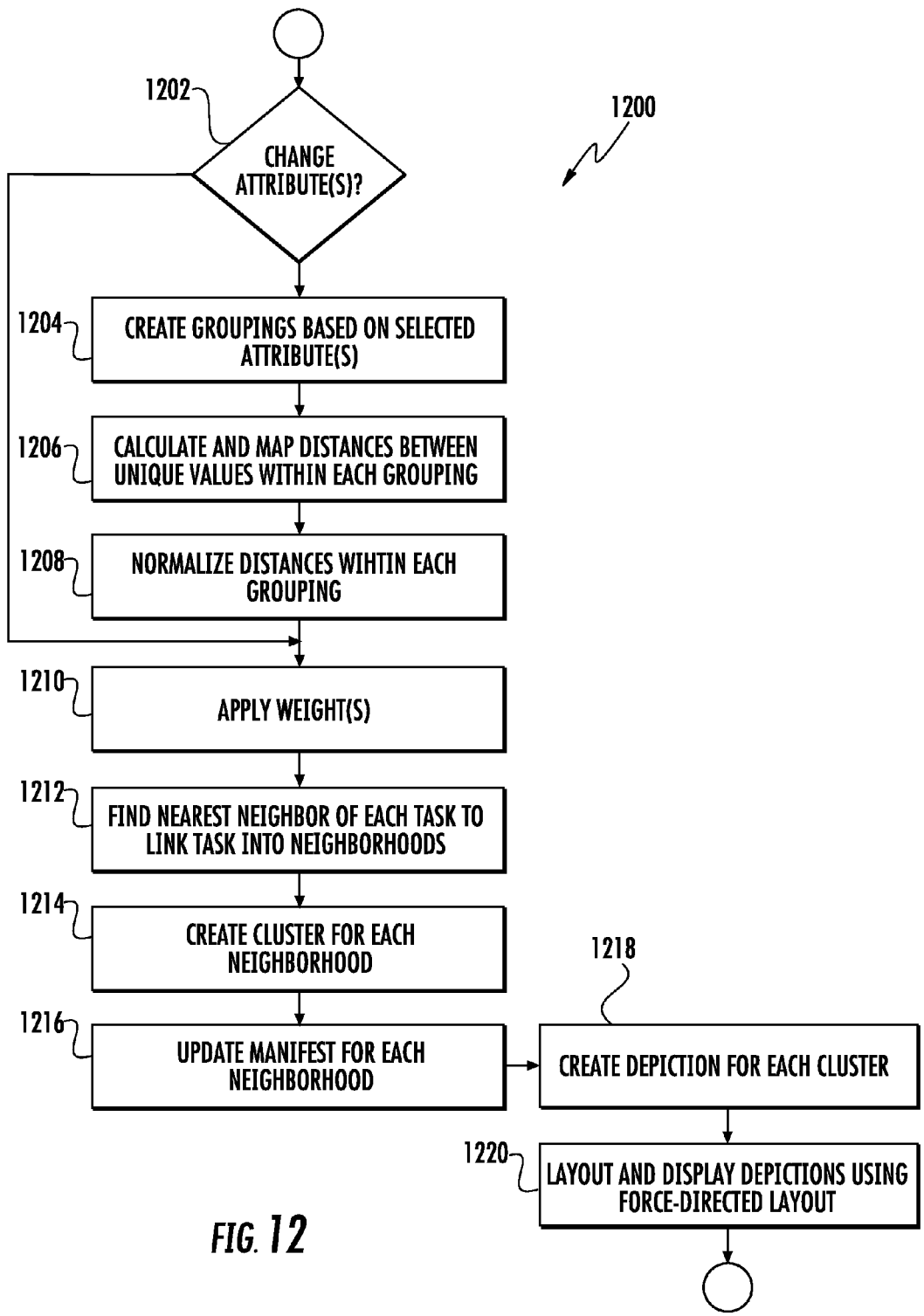

To further illustrate operations in methods that may be performed by the source lifecycle thread subsystem 402, target lifecycle thread subsystem 404 and clustering subsystem 500, reference is now made to respectively FIGS. 10, 11 and 12.

FIG. 10 is a flowchart illustrating various operations in a routine 1000 that may be performed by or with the source lifecycle thread subsystem 402, according to example implementations of the present disclosure. As shown at block 1002, the routine may include selection of a source network, process and hierarchical level, such as from a model of a hierarchical, well-ordered process. This source network may contain a plurality of processes in a plurality of hierarchical levels, with a process at a particular level being containing a lifecycle thread to be identified as the source lifecycle thread.

As shown at block 1004, user-selected criteria including one or more attributes and perhaps weights may be received for performance of a cluster analysis to cluster tasks based thereon. A user may select one or more clusters as candidates for the source lifecycle thread, as shown at block 1006. Here, the selected cluster(s) may contain tasks (source tasks) intended for the source lifecycle thread. The user may then have the option to review and refine the source lifecycle thread, such as by individual selection of tasks from a cluster to include or exclude from the source lifecycle thread, as shown at block 1008. As each task (source task) is selected for the source lifecycle thread, inputs to that task may be listed, enabling the user to include or exclude the inputs from the source lifecycle thread.

As shown at block 1010, a decision may be made as to whether all source tasks are included in the source lifecycle thread. In some examples, this decision is made based on the user's knowledge of the process intended to be captured by the source lifecycle thread. The user may verify that the earliest source task in the source lifecycle thread corresponds to an entry point in the process, that the latest or terminal source task in the source lifecycle thread corresponds to an exit point in the process, and that all necessary intermediate tasks are included. If all source tasks are included, the source lifecycle thread may be named and stored, as shown at block 1012. Otherwise, in the event that more source tasks are needed, the routine may return to cluster tasks on user-selected criteria (at block 1004), at which point the user may adjust the user-selected criteria or select different clusters for the source lifecycle thread.

FIG. 11 is a flowchart illustrating various operations in a routine 1100 that may be performed by or with the target lifecycle thread subsystem 404, according to example implementations of the present disclosure. As shown at block 1102, the routine may include selection of a target network, process and hierarchical level from a model of a hierarchical, well-ordered process, which may be the same or a different model from which the source network was selected. This source network may contain a plurality of processes in a plurality of hierarchical levels, with a process at a particular level containing a lifecycle thread to be identified as the source lifecycle thread. Then as shown at block 1104, the routine may include receipt of user-selected criteria, including attribute(s) and/or weight(s), and performance of a cluster analysis based thereon. In some examples, the operations at 1102 and 1104 may be performed in a manner similar to those for the source lifecycle thread at 1002 and 1004, including identification of a process at a particular level of a target network containing a plurality of processes at a plurality of hierarchical levels.

As shown at block 1106, the cluster analysis for the target lifecycle thread may produce a list of candidate target tasks. In some examples, the list of candidate target tasks is produced through one or more distance maps, which enables the user to change candidates based on interactive knowledge discovery, as described above. In other examples, the list of candidate target tasks is produced through string similarity of the task names. In these other examples, string similarity may be determined by dividing twice the count of words different between two task names by the sum of the unique word count in each name.

After production of the candidate target tasks, a determination may then be made if the candidate target tasks include a candidate target task matching a source task from the source lifecycle thread, as shown at block 1108. A match may be determined based on a measure of similarity between the candidate target task and source task, such as through the distance map(s) or string similarity. In some examples, the match may be determined by the user based on the user's knowledge of the overall model and naming conventions to associate task names with the target tasks.

In instances in which there is no match, the routine 1100 may return to clustering tasks on user-selected criteria (block 1104), at which point the user may adjust the user-selected criteria or select different clusters for the target lifecycle thread. On the other hand, in instances in which there is a match, the match may be confirmed, and the user may be prompted to name the target lifecycle thread for storage, as shown at block 1110. The target lifecycle thread subsystem 404 may then produce a list of candidate target inputs, as shown at block 1112. Similar to before, this list may be produced through distance map(s) or string similarity of task names. In some examples, this list may also be constrained to maintain well-ordering of the target tasks in the target lifecycle thread.

As shown at block 1114, the routine 1100 may then include a determination of a match of the candidate target inputs and an input to the matched source task (block 1108). Similar to before, this match may be determined based on a measure of similarity between the candidate target task and source task, such as through the distance map(s) or string similarity. In some examples, the match may be determined by the user based on the user's knowledge of the overall model and naming conventions to associate task names with the target tasks. In instances in which a match is found, the match may be confirmed and any missing input between the matched candidate target task and the matching candidate target input may be defined, as shown at block 1116. The routine may then continue for each unmatched source input in the source lifecycle thread, as shown at block 1118, and then back up to block 1112.

FIG. 12 is a flowchart illustrating various operations in a subroutine 1200 that may be performed by or with the clustering subsystem 500, according to example implementations of the present disclosure. As shown, for example, the subroutine may include a determination of whether to change the user-selected criteria such as one or more attributes on which the tasks are clustered, as shown at block 1202. This may be the case when previous clusters do not collect together a desired set of tasks, and in which distance maps may have been generated for groupings of one or more attributes selected as user-selected criteria.

In instances in which the attributes on which the tasks are clustered changes, groupings may be created based on the attributes in the user-selected criteria, as shown at block 1204. The subroutine 1200 may then calculate and map distances between unique values within the grouping for each attribute of the user-selected criteria, as shown at block 1206. As discussed above, this map stores the unique values of distance for each selected attribute.

The subroutine 1200 may normalize the distances within each grouping, such as to adjust the values to range between 0.0 and 1.0, as shown at block 1208. In some examples, the normalized values may also be squared to thereby produce quadrance components. Any weights for the attributes of the user-selected criteria may be applied, as shown at block 1210. As discussed above, the attributes and/or weights may be adjusted in a process of trial and failure until clusters of lifecycle thread targets are found.

The tasks may then be organized into clusters using the distance maps with any weights applied. More particularly, as shown at block 1212, the subroutine 1200 may find the nearest neighbor of each product to link all products into neighborhoods. In some examples, the nearest neighbor is found by iterating through the tasks and finding a task with a minimum distance according to the user-selected clustering criteria (attributes and any weights). Several tasks may have the same minimum distance; and in that case, any task with a minimum distance may be selected.

The subroutine 1200 may create a cluster for each neighborhood, which may collect together tasks into clusters of nearest neighbors according to the user-selected criteria, as shown at block 1214. A manifest may contain and maintain groupings and clusters in their current state, and this manifest may be updated after the cluster is created for each neighborhood, as shown at block 1216. A depiction of each cluster may be created, with the depiction being a graphical container collecting the tasks in a cluster, as shown at block 1218. And then the subroutine may layout and display the clusters, such as using a force-directed layout, as shown at block 1220. A force-directed layout simulates repulsive forces between tasks and simulates springs or attractive forces between neighbors, which arranges the tasks in three-dimensional space. This results in a display of the clusters.

Further to the above, the manifest created and updated throughout the subroutine 1200 contains and maintains grouping information and the current clustering state. The grouping construct may be instantiated for each user-selected attribute, and each may include a mapping between the unique values of a respective attribute and the distances between those values (as defined by each attribute's distance metric implementation). The clustering state, then, may be the association of tasks with clusters. Table 2 above provides an example of the mapping between URI 0.8.68.1 and all other unique URI's. A grouping is responsible for a similar map for every other URI within Table 2.

The manifest and its grouping and distance map structure may require computationally-demanding distance calculations, but may also be created only once per user session (e.g., during its initialization). The unique value distance mapping of the grouping may maintains distances as quadrance components for each attribute, eliminating the need for repeated squaring and performance of square-root-computation. Unique value mapping (storing only unique values rather than attribute distances for every task) also reduces memory requirements needed for processing. This allows a user to quickly and interactively adjust relative attribute weights, achieving desired clustering results.

To even further illustrate example implementations, reference is now made to FIGS. 13-17, which illustrate displays of a graphical user interface (GUI) that may be provided by the lifecycle thread establishment and replication system 400 during an interactive user session in which the above routines 1000, 1100 and subroutine 1200 may be performed. In these figures, the operations are performed in the context of processes for design and construction of a house, including processes for design and installation of carpet and shoe base moulding in a room of a house, which are further examples of suitable processes for production of a product (a house).

Figure 13:
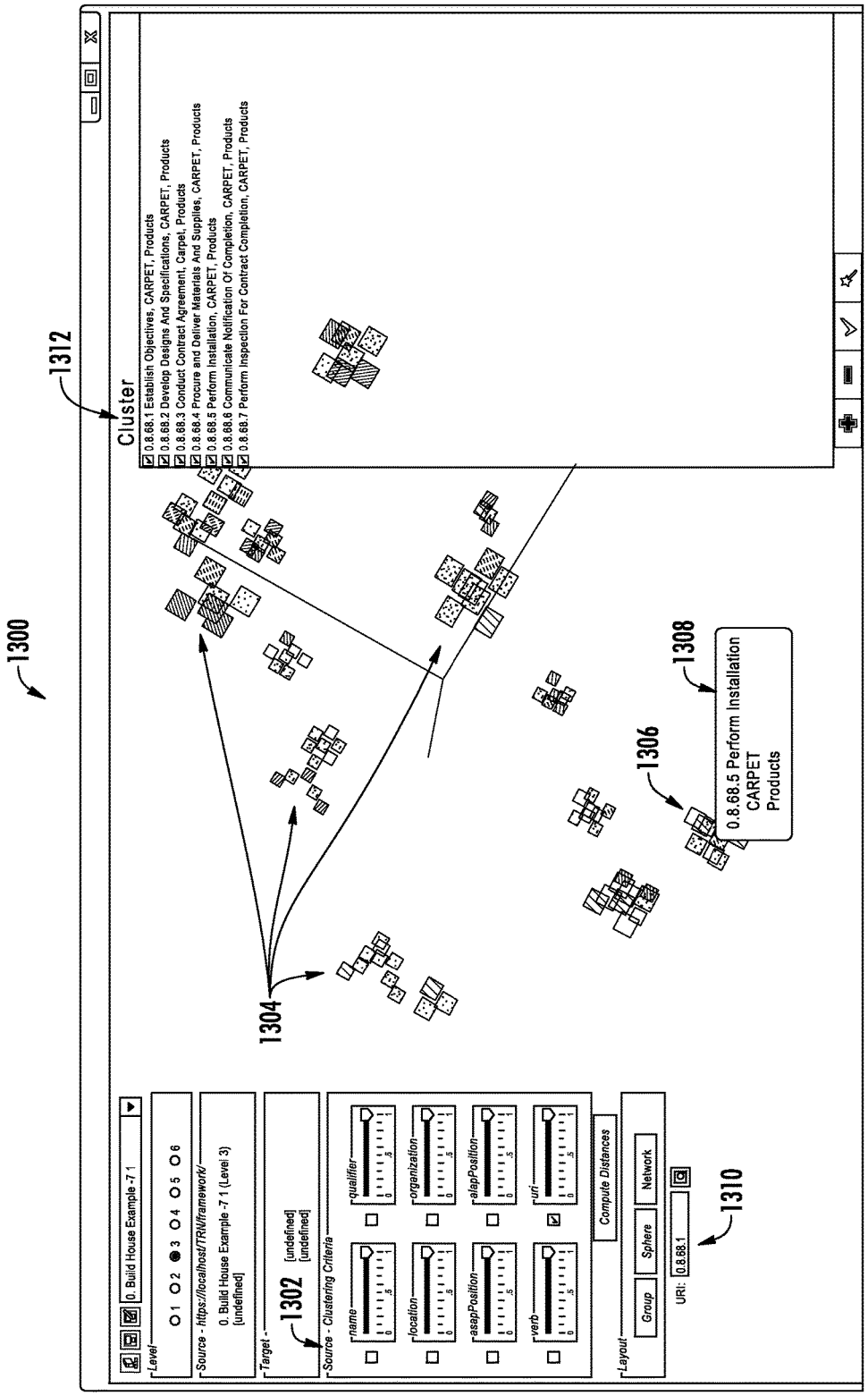
FIGS. 13, 14, 15, 16 and 17 illustrate displays of a graphical user interface (GUI) according to example implementations.

FIG. 13 illustrates a display 1300 of the GUI including the results of clustering tasks for the design and installation of carpet using the URI attribute and a weight of 1.0 as the user-selected criteria, which are shown in a panel 1302 of the GUI. But as the tasks in this example are clustered on only a single attribute, the weight has no practical effect on the resulting clusters. The GUI also illustrates various clusters 1304 that have been produced. A selected cluster of interest for establishing a source lifecycle thread is shown as 1306. Hover text 1308 enables the user to inspect the tasks within a cluster to find the cluster of interest, and a search box 1310 allows the user to search for a URI of interest within the clusters. When a cluster is selected, the user may add tasks into the source lifecycle thread using the checkboxes in panel 1312.

Table 3 below shows the selected cluster from FIG. 13 in tabular format. Each URI is unique and has a distance of 0.111111 from its nearest neighbor.

TABLE 3

| URI | Neighbor | Distance | Name | Organization | Verb |
|---|---|---|---|---|---|
| 0.8.68.1 | 0.8.68.2 | 0.111111 | Objectives | General Contractor Admin X | Establish |
| 0.8.68.2 | 0.8.68.6 | 0.111111 | Designs & Specs. | Designer X | Develop |
| 0.8.68.3 | 0.8.68.2 | 0.111111 | Contract Agreement | General Contractor Admin X | Conduct |
| 0.8.68.4 | 0.8.68.2 | 0.111111 | Materials & Supplies | Carpet Sub X | Procure and Deliver |
| 0.8.68.5 | 0.8.68.2 | 0.111111 | Installation | Carpet Sub X | Perform |
| 0.8.68.6 | 0.8.68.3 | 0.111111 | Notification - Completion | Carpet Sub X | Communicate |
| 0.8.68.7 | 0.8.68.2 | 0.111111 | Inspection - Contract Completion | General Contractor Inspector X | |

Each URI distance is likewise unique and stored in a distance map, a part of which is excerpted as Table 2 (above). This shows that the distance from URI 0.8.68.1 to other URI's are as much as 1.0, and as small as 0.111, making any URI with a value of 0.111 a nearest neighbor.

Figure 14:
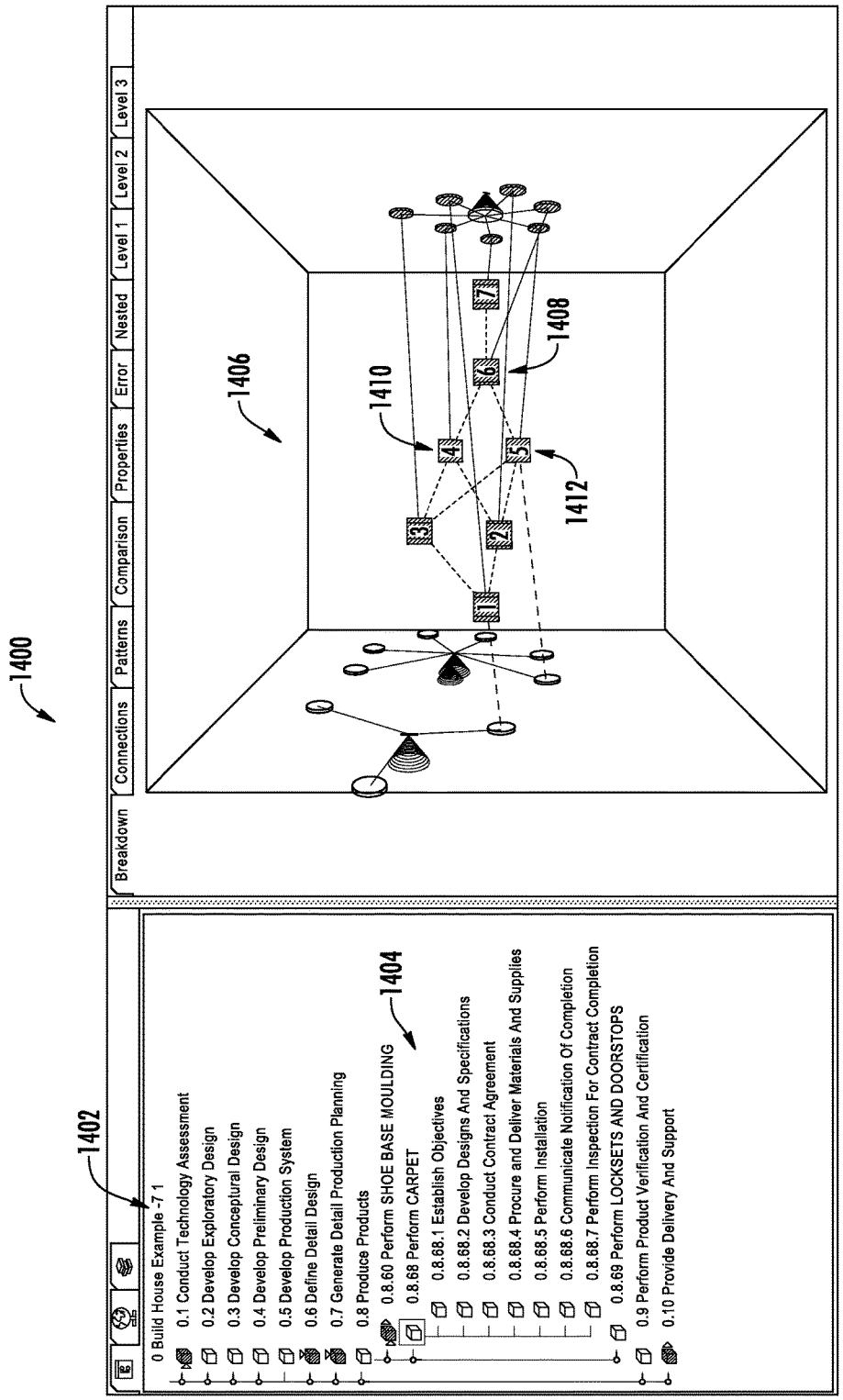

FIG. 14 illustrates a display 1400 of the GUI including the tasks and inputs for an example source lifecycle thread for the design and installation of carpet. A hierarchy of data deliverables is shown in a tree 1402 that includes the tasks 1404 for the carpet lifecycle. The breakdown of the tasks and their relationships are illustrated in the breakdown layout 1406, which is one example of a layout as described in the above-referenced '904 patent. In this layout, for example, task 1408 requires inputs from tasks 1410 and 1412.

Figure 15:
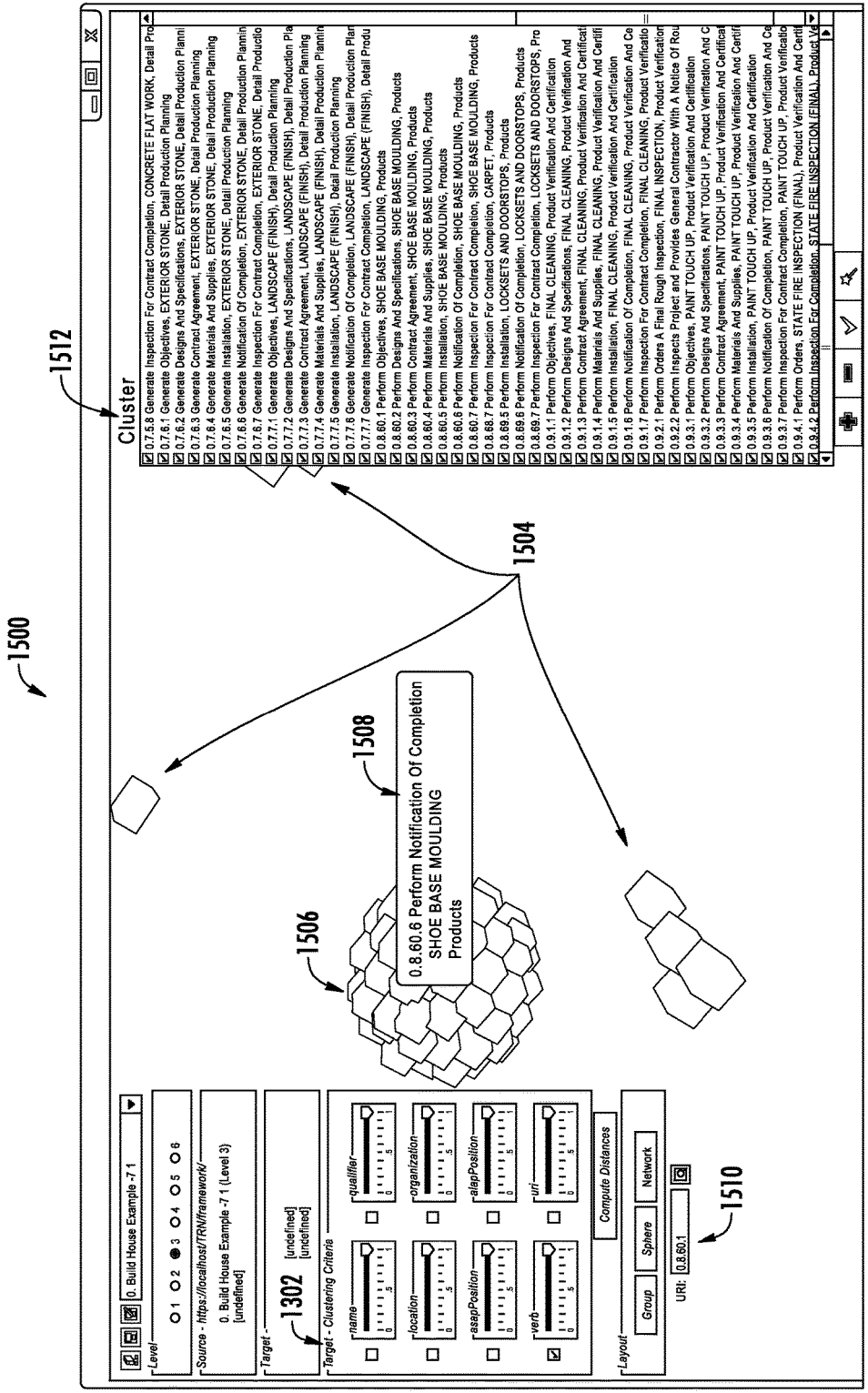

FIG. 15 illustrates a display 1500 of the GUI including the results of clustering tasks for the design and installation of shoe base moulding using the verb attribute and a weight of 1.0 as the user-selected criteria, which are shown in a panel 1502 of the GUI. Again, as the tasks in this example are clustered on only a single attribute, the weight has no practical effect on the resulting clusters. The GUI also illustrates various clusters 1504 that have been produced. A selected duster of interest for establishing a target lifecycle thread is shown as 1506. Hover text 1508 enables the user to inspect the tasks within a cluster to find the cluster of interest, and the search box 1510 allows the user to search for a URI of interest within the clusters. When a cluster is selected, the user may add tasks into the candidate target tasks using the checkboxes in panel 1512.

Table 4 below shows the selected cluster from FIG. 15 in tabular format. In this cluster, the tasks have no verb assigned, and have a distance of 0.0 from each nearest neighbor.

TABLE 3

| URI | Neighbor | Distance | Name | Organization |
|---|---|---|---|---|
| 0.1.1.1 | 0.3.1.4 | 0.0 | Marketing & Sales | General Contractor Admin X |
| 0.1.1.2 | 0.3.1.4 | 0.0 | Contract Agreement | General Contractor Admin X |
| 0.2.1.1 | 0.3.1.4 | 0.0 | Meet with Owner and Establish Project Vision/Goals | General Contractor DRB |
| 0.2.1.2 | 0.3.1.4 | 0.0 | Prepare Design Guidelines for | Subdivision X |

TABLE 3-continued

| URI | Neighbor | Distance | Name | Organization |
|---|---|---|---|---|
| 0.8.60.2 | 0.3.1.4 | 0.0 | Project X Designs & Specs. | Designer X |
| 0.8.60.3 | 0.3.1.4 | 0.0 | Contract Agreement | General Contractor Admin X |
| 0.8.60.4 | 0.3.1.4 | 0.0 | Materials & Supplies | General Contractor Frame Crew A |
| 0.8.60.5 | 0.3.1.4 | 0.0 | Installation | General Contractor Frame Crew A |
| 0.8.60.6 | 0.3.1.4 | 0.0 | Notification - Completion | General Contractor Frame Crew A |
| 0.8.60.7 | 0.3.1.4 | 0.0 | Inspection - Contract Completion | General Contractor Inspector X |
| 0.8.68.7 | 0.3.1.4 | 0.0 | Inspection - Contract Completion | General Contractor Inspector X |
| 0.8.69.5 | 0.3.1.4 | 0.0 | Installation | General Contractor Finish Crew A |
| 0.8.69.6 | 0.3.1.4 | 0.0 | Notification - Completion | General Contractor Finish Crew A |
| 0.8.69.7 | 0.3.1.4 | 0.0 | Inspection - Contract Completion | General Contractor Inspector X |
| 0.9.1.1 | 0.3.1.4 | 0.0 | Objectives | General Contractor Admin X |
| 0.9.1.2 | 0.3.1.4 | 0.0 | Designs & Specs. | Designer X |
| 0.9.1.3 | 0.3.1.4 | 0.0 | Contract Agreement | General Contractor Admin X |
| 0.9.1.4 | 0.3.1.4 | 0.0 | Materials & Supplies | Construction Cleaning Sub X |
| 0.9.1.5 | 0.3.1.4 | 0.0 | Installation | Construction |

TABLE 3-continued

| URI | Neighbor | Distance | Name | Organization |
|---|---|---|---|---|
| 0.9.1.6 | 0.3.1.4 | 0.0 | Notification - Completion | Cleaning Sub X Construction Cleaning Sub X |

All non-zero distances are stored in a distance map in which the distance between different verbs may be 1.0, and by omission the distance between the same verb, or in this case the distance between tasks with no assigned verb, may be 0.0. This is shown in Table 4 below.

TABLE 4

| | |
|---|---|
| From "Establish": | |
| to "Develop" = | 1 |
| From "Develop": | |
| From "Perform": | |
| to "Establish" = | 1 |
| to "Communicate" = | 1 |
| to "Procure and Deliver" = | 1 |
| to "Conduct" = | 1 |
| From "Communicate" | |
| to "Establish" = | 1 |
| to "Develop" = | 1 |
| to "Procure and Deliver" = | 1 |
| From "Procure and Deliver" | |
| to "Establish" = | 1 |
| to "Develop" = | 1 |
| From "Conduct" | |
| to "Establish" = | 1 |
| to "Develop" = | 1 |
| to "Communicate" = | 1 |
| to "Procure and Deliver" = | 1 |

Table 5 below shows two clusters resulting from setting the weight for verb to 0.5, and URI to 1.0. In the table, a distance of 0.6111 can be seen between neighbors 0.8.60.1 and 0.8.60.2. This distance may be calculated by taking half of the verb distance of 1.0 (Table 4), plus the distance of 0.111 from a distance map for URI. As the distance tables are unchanged, this demonstrates how the weights may be adjusted without again generating the distance maps.

TABLE 5

| URI | Neighbor | Distance | Name | Organization | Verb |
|---|---|---|---|---|---|
| 0.8.60.1 | 0.8.60.2 | 0.611111 | Objectives | General Contractor Admin X | Establish |
| 0.8.60.2 | 0.8.68.2 | 0.444444 | Designs & Specs. | Designer X | Develop |
| 0.8.60.3 | 0.8.60.2 | 0.611111 | Contract Agreement | General Contractor Admin X | Conduct |
| 0.8.60.4 | 0.8.68.4 | 0.444444 | Materials & Supplies | General Contractor Frame Crew A | Procure and Deliver |
| 0.8.60.6 | 0.8.60.2 | 0.611111 | Notification - Completion | General Contractor Frame Crew A | Communicate |
| 0.8.68.1 | 0.8.60.1 | 0.444444 | Objectives | General Contractor Admin X | Establish |
| 0.8.68.2 | 0.8.68.6 | 0.611111 | Designs & Specs. | Designer X | Develop |
| 0.8.68.3 | 0.8.60.3 | 0.444444 | Contract Agreement | General Contractor Admin X | Conduct |
| 0.8.68.4 | 0.8.68.6 | 0.611111 | Materials & Supplies | Carpet Sub X | Procure and Deliver |
| 0.8.68.5 | 0.8.68.6 | 0.611111 | Installation | Carpet Sub X | Perform |
| 0.8.68.6 | 0.8.60.6 | 0.444444 | Notification - Completion | Carpet Sub X | Communicate |

| URI | Neighbor | Distance | Name | Organization |
|---|---|---|---|---|
| 0.1.1.1 | 0.7.4.2 | 1.0 | Marketing & Sales | General Contractor Admin X |
| 0.1.1.2 | 0.1.1.1 | 0.111111 | Contract Agreement | General Contractor Admin X |
| 0.4.1.1 | 0.4.1.2 | 0.111111 | Complete Prelim. Design & Spec. for X | Designer X |
| 0.4.1.2 | 0.7.4.2 | 1.0 | Approve Prelim. Design & Spec for X and Notify Designer X | Owner X |
| 0.7.4.1 | 0.7.4.2 | 0.111111 | Objectives | General Contractor Admin X |
| 0.7.4.2 | 0.7.4.7 | 0.111111 | Designs & Specs. | Designer X |
| 0.7.4.3 | 0.7.4.2 | 0.111111 | Contract Agreement | General Contractor Admin X |
| 0.7.4.4 | 0.7.4.2 | 0.111111 | Materials & Supplies | Landscape Sub X |
| 0.7.4.5 | 0.7.4.2 | 0.111111 | Layout | General Contractor Layout Crew X |
| 0.7.4.6 | 0.7.4.2 | 0.111111 | Installation | Landscape Sub X |
| 0.7.4.7 | 0.7.4.4 | 0.111111 | Notification - Completion | Landscape Sub X |

TABLE 5-continued

| 0.7.4.8 | 0.7.4.2 | 0.111111 | Inspection - Contract Completion | General Contractor Inspector X |

Figure 16:
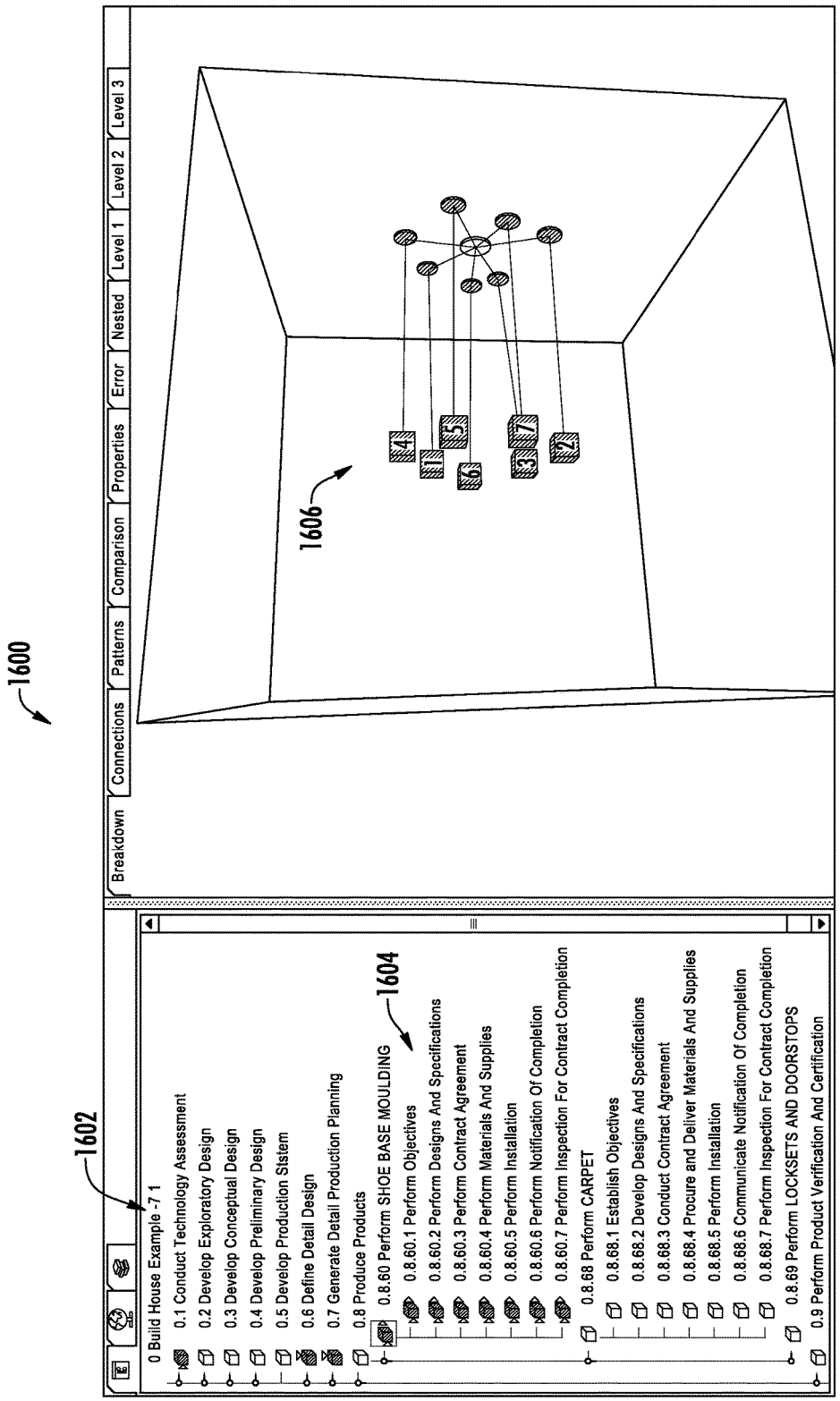

FIG. 16 illustrates a display 1600 of the GUI including the tasks and inputs for an example target lifecycle thread for the design and installation of shoe base moulding. A hierarchy of data deliverables is shown in a tree 1602 that includes the tasks 1604 for the carpet lifecycle. The breakdown of the tasks and their relationships are illustrated in the breakdown layout 1606, which, again, is one example of a layout as described in the above-referenced '904 patent. In this layout, for example, relationships between the tasks have not yet been defined, but will be defined as the target lifecycle thread is matched to the source lifecycle thread.

Figure 17:
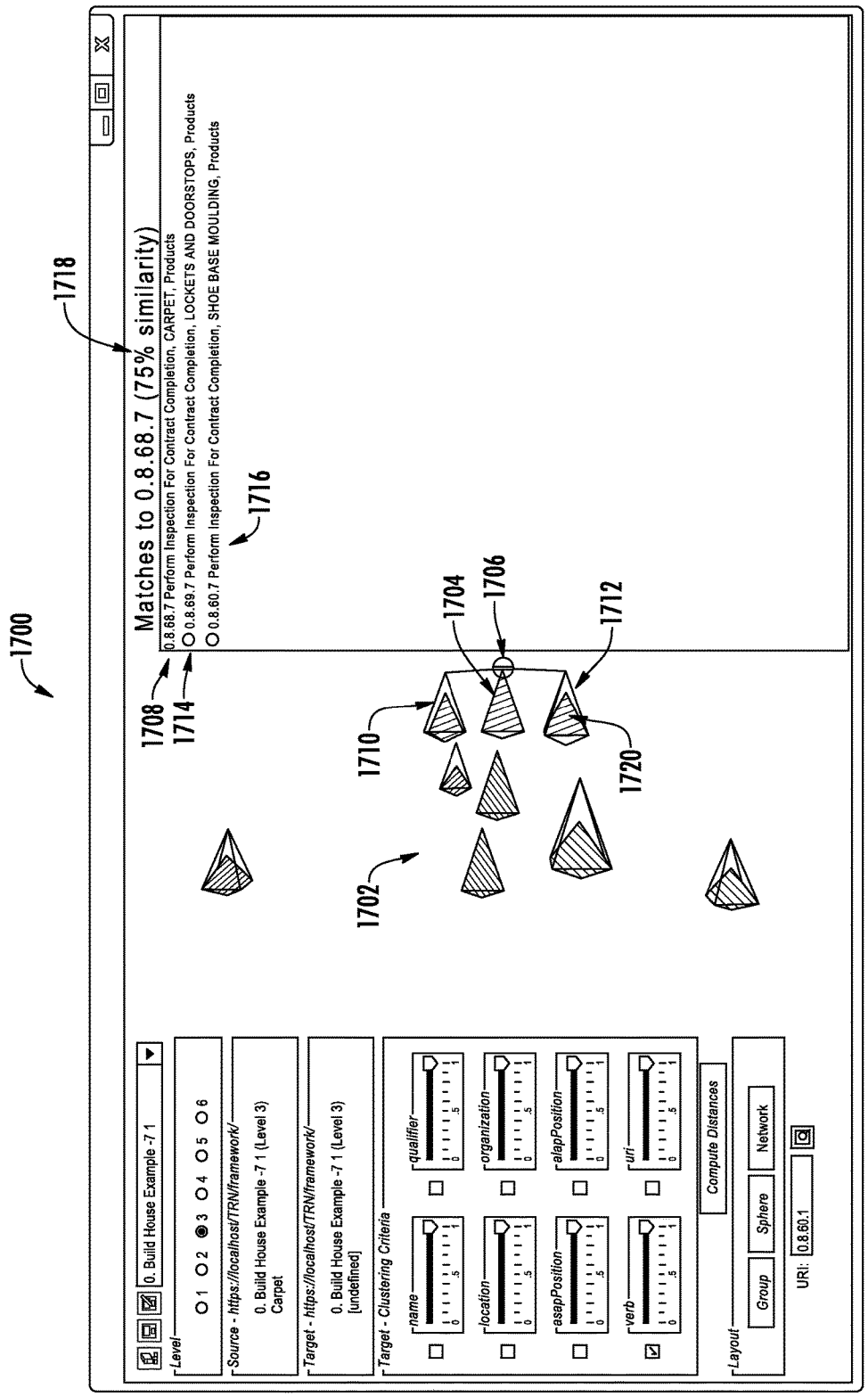

FIG. 17 illustrates a display 1700 of the GUI illustrating candidate target tasks. The display includes a source lifecycle thread 1702 (without precedences being shown). A particular source task 1704 under consideration is indicated by a sphere 1706. In this example, the particular source task is identified as "Perform Inspection for Contract Completion CARPET, Products" at 1708. Two candidate target tasks are illustrated at 1710 and 1712; and identified as "Perform Inspection for Contract Completion LOCKSETS AND DOORSTOPS, Products" and "Perform Inspection for Contract Completion SHOE BASE MOULDING, Products" at respectively 1714 and 1716. Similarly, the target lifecycle thread subsystem 404 may indicate a 75% similarity at 1718, and may also do so graphically by an amount of fill 1720 of the tetrahedron shape for the candidate target tasks. The user may now determine whether to match the source task to either of the candidate target tasks; and in this example, the candidate target task related to shoe base moulding may be selected as it relates to the subject matter of the target lifecycle thread.

According to example implementations of the present disclosure, the lifecycle thread establishment and replication system 400 and its subsystems including the source lifecycle thread subsystem 402 and target lifecycle thread subsystem 404 may be implemented by various means. Similarly, the clustering subsystem 500 and its subsystems including input interface 502, duster analysis engine 504 and task selector 506 may be implemented by various means. Means for implementing the system and its subsystems may include hardware, alone or under direction of one or more computer programs from a computer-readable storage medium. In some examples, one or more apparatuses may be configured to function as or otherwise implement the system and its subsystems shown and described herein. In examples involving more than one apparatus, the respective apparatuses may be connected to or otherwise in communication with one another in a number of different manners, such as directly or indirectly via a wired or wireless network or the like.

Figure 18:
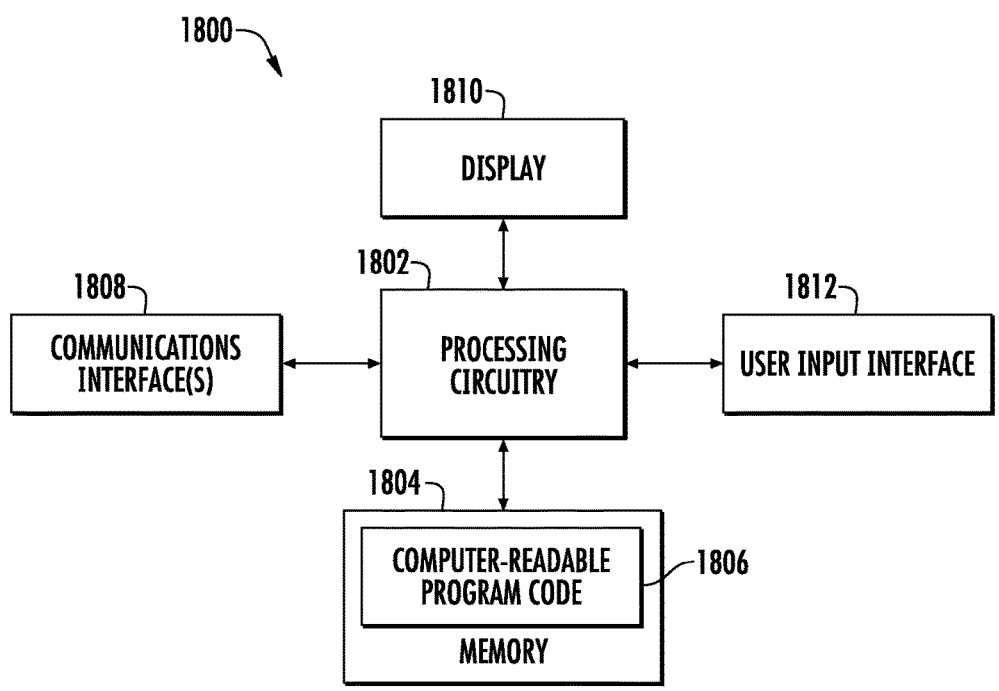
FIG. 18 illustrates an apparatus according to some example implementations.

FIG. 18 illustrates an apparatus 1800 according to some example implementations of the present disclosure. Generally, an apparatus of exemplary implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, processing circuitry 1802 (e.g., processor unit) connected to a memory 1804 (e.g., storage device).

The processing circuitry 1802 may be composed of one or more processors alone or in combination with one or more memories. The processing circuitry is generally any piece of computer hardware that is capable of processing information such as, for example, data, computer programs and/or other suitable electronic information. The processing circuitry is composed of a collection of electronic circuits some of which may be packaged as an integrated circuit or multiple interconnected integrated circuits (an integrated circuit at times more commonly referred to as a "chip"). The processing circuitry may be configured to execute computer programs, which may be stored onboard the processing circuitry or otherwise stored in the memory 1804 (of the same or another apparatus).

The processing circuitry 1802 may be a number of processors, a multi-core processor or some other type of processor, depending on the particular implementation. Further, the processing circuitry may be implemented using a number of heterogeneous processor systems in which a main processor is present with one or more secondary processors on a single chip. As another illustrative example, the processing circuitry may be a symmetric multi-processor system containing multiple processors of the same type. In yet another example, the processing circuitry may be embodied as or otherwise include one or more ASICs, FPGAs or the like. Thus, although the processing circuitry may be capable of executing a computer program to perform one or more functions, the processing circuitry of various examples may be capable of performing one or more functions without the aid of a computer program. In either instance, the processing circuitry may be appropriately programmed to perform functions or operations according to example implementations of the present disclosure.

The memory 1804 is generally any piece of computer hardware that is capable of storing information such as, for example, data, computer programs (e.g., computer-readable program code 1806) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory 1804, the processing circuitry 1802 may also be connected to one or more interfaces for displaying, transmitting and/or receiving information. The interfaces may include a communications interface 1808 (e.g., communications unit) and/or one or more user interfaces. The communications interface may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless MC (WNIC) or the like.

The user interfaces may include a display 1810 and/or one or more user input interfaces 1812 (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by processing circuitry that is thereby programmed, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, processing circuitry or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processing circuitry or other programmable apparatus to configure the computer, processing circuitry or other programmable apparatus to execute operations to be performed on or by the computer, processing circuitry or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processing circuitry or other programmable apparatus provide operations for implementing functions described herein.

Execution of instructions by processing circuitry, or storage of instructions in a computer-readable storage medium, supports combinations of operations for performing the specified functions. In this manner, an apparatus 1800 may include processing circuitry 1802 and a computer-readable storage medium or memory 1804 coupled to the processing circuitry, where the processing circuitry is configured to execute computer-readable program code 1806 stored in the memory. It will also be understood that one or more functions, and combinations of functions, may be implemented by special purpose hardware-based computer systems and/or processing circuitry which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus for processing data to establish lifecycle threads in the development of a structural product, the apparatus comprising:

a memory storing process-related information describing at least one hierarchical, well-ordered process expressible as at least one network including a plurality of tasks to produce internal products corresponding to components of at least one structural product produced thereby, at least some of the plurality of tasks having a precedence relationship whereby the internal product produced by one task is an input to another task; and processing circuitry configured to access the memory, and programmed to at least:

define a source lifecycle thread from the process-related information; and define and match a target lifecycle thread to the source lifecycle thread, the source lifecycle thread and target lifecycle thread each being expressible as a sub-network of respectively source tasks and target tasks selected from the plurality of tasks, the target tasks having at least a threshold similarity with the source tasks, and inputs to the target tasks having at least a threshold similarity with inputs to the source tasks, wherein the process-related information describes the plurality of tasks by a plurality of attributes, and the processing circuitry being programmed to either or each of define the source lifecycle thread, or define and match the target lifecycle thread, includes being programmed to at least:

receive user selection of an attribute of the plurality of attributes as user-selected criteria;

perform a cluster analysis according to the user-selected criteria to produce a plurality of clusters of candidate tasks from the plurality of tasks, the processing circuitry being programmed to perform the cluster analysis including being programmed to form a grouping of the plurality of tasks according to the attribute, generate a distance map for the grouping including only unique values of the attribute and distances between the unique values, and organize the tasks into the plurality of clusters of candidate tasks according to distance using the distance map; and select tasks from the plurality of clusters of candidate tasks for the source tasks or target tasks.

2. The apparatus of claim 1, wherein the processing circuitry being programmed to receive user selection of the attribute includes being programmed to receive user selection of a plurality of attributes as the user-selected criteria, wherein the processing circuitry being programmed to form the grouping includes being programmed to form a respective plurality of groupings according to the plurality of attributes, being programmed to generate the distance map includes being programmed to generate a distance map for each grouping of the respective plurality of groupings, and being programmed to organize the tasks includes being programmed to organize the tasks using the distance map for each grouping, and wherein the processing circuitry being programmed to select the tasks includes being programmed to select the tasks from a selected cluster of the plurality of clusters.

3. The apparatus of claim 2, wherein the processing circuitry being programmed to receive user selection of the plurality of attributes includes being programmed to receive user selection of the plurality of attributes and a weight for a particular attribute thereof as the user-selected criteria, and wherein the processing circuitry being programmed to perform the cluster analysis further includes being programmed to apply the weight to the distance map for the grouping according to the particular attribute, and being programmed to organize the tasks includes being programmed to organize the tasks using the distance map for each grouping including the distance map with the weight so applied.

4. The apparatus of claim 3, wherein the processing circuitry being programmed to define the source lifecycle thread or define the target lifecycle thread further includes being programmed to receive user selection of an adjusted weight for the particular attribute, and wherein the processing circuitry being programmed to perform the cluster analysis further includes being programmed to apply the adjusted weight to the distance map for the grouping according to the particular attribute, and reorganize the tasks using the distance map for each grouping including the distance map with the adjusted weight so applied.

5. The apparatus of claim 1, wherein the processing circuitry being programmed to each of define the source lifecycle thread, and define and match the target lifecycle thread, includes being programmed to receive user selection of the attribute, perform the cluster analysis and select the tasks, and wherein in an instance in which the attribute received for both the source lifecycle thread and target lifecycle thread is the same, the processing circuitry being programmed to define and match the target lifecycle thread includes being programmed to organize the tasks using the distance map generated during the cluster analysis for the source lifecycle thread without again generating the distance map during the cluster analysis for the target lifecycle thread.

6. The apparatus of claim 1, wherein the processing circuitry being programmed to define and match the target lifecycle thread includes being programmed to at least:

select a plurality of candidate target tasks from the plurality of tasks, the plurality of candidate target tasks being selected from the plurality of clusters of candidate tasks in an instance in which the processing circuitry being programmed to define and match the target lifecycle thread includes being programmed to perform the cluster analysis;

match a candidate target task to a particular source task of the source lifecycle thread; and back-chain through the source lifecycle thread including for each source task of at least some of the source tasks beginning with the particular source task, the processing circuitry being programmed to at least:

identify a preceding source task that inputs to the source task; and match another candidate target task to the preceding source task, the target lifecycle thread being composed of the candidate target task and other candidate target task matched to the preceding source task for each source task of the at least some of the source tasks.

7. The apparatus of claim 6, wherein in at least one instance in which the candidate target task and other candidate target task are precedence unrelated, the processing circuitry being programmed to back-chain through the source lifecycle thread further includes being programmed to define an input to the candidate target task from the other candidate target task to thereby establish a precedence relationship.

8. A method of processing data to establish and replicate lifecycle threads in the development of a structural product, the method comprising:

accessing, by processing circuitry, a memory storing process-related information describing at least one hierarchical, well-ordered process expressible as at least one network including a plurality of tasks to produce internal products corresponding to components of at least one structural product produced thereby, at least some of the plurality of tasks having a precedence relationship whereby the internal product produced by one task is an input to another task;

defining, by the processing circuitry, a source lifecycle thread from the process-related information; and defining and matching, by the processing circuitry, a target lifecycle thread to the source lifecycle thread, the source lifecycle thread and target lifecycle thread each being expressible as a sub-network of respectively source tasks and target tasks selected from the plurality of tasks, the target tasks having at least a threshold similarity with the source tasks, and inputs to the target tasks having at least a threshold similarity with inputs to the source tasks, wherein the process-related information describes the plurality of tasks by a plurality of attributes, and either or each of defining the source lifecycle thread, or defining and matching the target lifecycle thread, includes at least:

receiving user selection of an attribute of the plurality of attributes as user-selected criteria;

performing a cluster analysis according to the user-selected criteria to produce a plurality of clusters of candidate tasks from the plurality of tasks, performing the cluster analysis including forming a grouping of the plurality of tasks according to the attribute, generating a distance map for the grouping including only unique values of the attribute and distances between the unique values, and organizing the tasks into the plurality of clusters of candidate tasks according to distance using the distance map; and selecting tasks from the plurality of clusters of candidate tasks for the source tasks or target tasks.

9. The method of claim 8, wherein receiving user selection of the attribute includes receiving user selection of a plurality of attributes as the user-selected criteria,
wherein forming the grouping includes forming a respective plurality of groupings according to the plurality of attributes, generating the distance map includes generating a distance map for each grouping of the respective plurality of groupings, and organizing the tasks includes organizing the tasks using the distance map for each grouping, and
wherein selecting the tasks includes selecting the tasks from a selected cluster of the plurality of clusters.

10. The method of claim 9, wherein receiving user selection of the plurality of attributes includes receiving user selection of the plurality of attributes and a weight for a particular attribute thereof as the user-selected criteria, and
wherein performing the cluster analysis further includes applying the weight to the distance map for the grouping according to the particular attribute, and organizing the tasks includes organizing the tasks using the distance map for each grouping including the distance map with the weight so applied.

11. The method of claim 10, wherein defining the source lifecycle thread or defining the target lifecycle thread further includes receiving user selection of an adjusted weight for the particular attribute, and
wherein performing the cluster analysis further includes applying the adjusted weight to the distance map for the grouping according to the particular attribute, and reorganizing the tasks using the distance map for each grouping including the distance map with the adjusted weight so applied.

12. The method of claim 8, wherein each of defining the source lifecycle thread, and defining and matching the target lifecycle thread, includes receiving user selection of the attribute, performing the cluster analysis and selecting the tasks, and
wherein in an instance in which the attribute received for both the source lifecycle thread and target lifecycle thread is the same, defining and matching the target lifecycle thread includes organizing the tasks using the distance map generated during the cluster analysis for the source lifecycle thread without again generating the distance map during the cluster analysis for the target lifecycle thread.

13. The method of claim 8, wherein defining and matching the target lifecycle thread includes at least:
selecting a plurality of candidate target tasks from the plurality of tasks, the plurality of candidate target tasks being selected from the plurality of clusters of candidate tasks in an instance in which defining and matching the target lifecycle thread includes performing the cluster analysis;
matching a candidate target task to a particular source task of the source lifecycle thread; and
back-chaining through the source lifecycle thread including for each source task of at least some of the source tasks beginning with the particular source task:
identifying a preceding source task that inputs to the source task; and
matching another candidate target task to the preceding source task, the target lifecycle thread being composed of the candidate target task and other candidate target task matched to the preceding source task for each source task of the at least some of the source tasks.

14. The method of claim 13, wherein in at least one instance in which the candidate target task and other candidate target task are precedence unrelated, back-chaining through the source lifecycle thread further includes defining an input to the candidate target task from the other candidate target task to thereby establish a precedence relationship.

15. A computer-readable storage medium for processing data to establish and replicate lifecycle threads in the development of a structural product, the computer-readable storage medium being non-transitory and having computer-readable program code portions stored therein that in response to execution by processing circuitry, cause an apparatus to at least:
access a memory storing process-related information describing at least one hierarchical, well-ordered process expressible as at least one network including a plurality of tasks to produce internal products corresponding to components of at least one product produced thereby, at least some of the plurality of tasks having a precedence relationship whereby the internal product produced by one task is an input to another task;
define a source lifecycle thread from the process-related information; and
define and match a target lifecycle thread to the source lifecycle thread, the source lifecycle thread and target lifecycle thread each being expressible as a sub-network of respectively source tasks and target tasks selected from the plurality of tasks, the target tasks having at least a threshold similarity with the source tasks, and inputs to the target tasks having at least a threshold similarity with inputs to the source tasks,
wherein the process-related information describes the plurality of tasks by a plurality of attributes, and the apparatus being caused to either or each of define the source lifecycle thread, or define and match the target lifecycle thread, includes being caused to at least:
receive user selection of an attribute of the plurality of attributes as user-selected criteria;
perform a cluster analysis according to the user-selected criteria to produce a plurality of clusters of candidate tasks from the plurality of tasks, the apparatus being caused to perform the cluster analysis including being caused to form a grouping of the plurality of tasks according to the attribute, generate a distance map for the grouping including only unique values of the attribute and distances between the unique values, and organize the tasks into the plurality of clusters of candidate tasks according to distance using the distance map; and
select tasks from the plurality of clusters of candidate tasks for the source tasks or target tasks.

16. The computer-readable storage medium of claim 15, wherein the apparatus being caused to receive user selection of the attribute includes being caused to receive user selection of a plurality of attributes as the user-selected criteria,
wherein the apparatus being caused to form the grouping includes being caused to form a respective plurality of groupings according to the plurality of attributes, being caused to generate the distance map includes being caused to generate a distance map for each grouping of the respective plurality of groupings, and being caused to organize the tasks includes being caused to organize the tasks using the distance map for each grouping, and
wherein the apparatus being caused to select the tasks includes being caused to select the tasks from a selected cluster of the plurality of clusters.

17. The computer-readable storage medium of claim 16, wherein the apparatus being caused to receive user selection of the plurality of attributes includes being caused to receive user selection of the plurality of attributes and a weight for a particular attribute thereof as the user-selected criteria, and
wherein the apparatus being caused to perform the cluster analysis further includes being caused to apply the weight to the distance map for the grouping according to the particular attribute, and being caused to organize the tasks includes being caused to organize the tasks using the distance map for each grouping including the distance map with the weight so applied.

18. The computer-readable storage medium of claim 17, wherein the apparatus being caused to define the source lifecycle thread or define the target lifecycle thread further includes being caused to receive user selection of an adjusted weight for the particular attribute, and
wherein the apparatus being caused to perform the cluster analysis further includes being caused to apply the adjusted weight to the distance map for the grouping according to the particular attribute, and reorganize the tasks using the distance map for each grouping including the distance map with the adjusted weight so applied.

19. The computer-readable storage medium of claim 15, wherein the apparatus being caused to each of define the source lifecycle thread, and define and match the target lifecycle thread, includes being caused to receive user selection of the attribute, perform the cluster analysis and select the tasks, and
wherein in an instance in which the attribute received for both the source lifecycle thread and target lifecycle thread is the same, the apparatus being caused to define and match the target lifecycle thread includes being caused to organize the tasks using the distance map generated during the cluster analysis for the source lifecycle thread without again generating the distance map during the cluster analysis for the target lifecycle thread.

20. The computer-readable storage medium of claim 15, wherein the apparatus being caused to define and match the target lifecycle thread includes being caused to at least:
select a plurality of candidate target tasks from the plurality of tasks, the plurality of candidate target tasks being selected from the plurality of clusters of candidate tasks in an instance in which the apparatus being caused to define and match the target lifecycle thread includes being caused to perform the cluster analysis;
match a candidate target task to a particular source task of the source lifecycle thread; and
back-chain through the source lifecycle thread including for each source task of at least some of the source tasks beginning with the particular source task, the apparatus being caused to at least:
identify a preceding source task that inputs to the source task; and
match another candidate target task to the preceding source task, the target lifecycle thread being composed of the candidate target task and other candidate target task matched to the preceding source task for each source task of the at least some of the source tasks.

21. The computer-readable storage medium of claim 20, wherein in at least one instance in which the candidate target task and other candidate target task are precedence unrelated, the apparatus being caused to back-chain through the source lifecycle thread further includes being caused to define an input to the candidate target task from the other candidate target task to thereby establish a precedence relationship.

* * * * *